(12) United States Patent
Wan Azha

(10) Patent No.: US 11,552,065 B2
(45) Date of Patent: Jan. 10, 2023

(54) SEMICONDUCTOR DEVICE

(71) Applicant: FUJI ELECTRIC CO., LTD., Kawasaki (JP)

(72) Inventor: Bin Wan Mat Wan Azha, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 100 days.

(21) Appl. No.: 17/004,182

(22) Filed: Aug. 27, 2020

(65) Prior Publication Data

US 2021/0082898 A1 Mar. 18, 2021

(30) Foreign Application Priority Data

Sep. 12, 2019 (JP) .............................. JP2019-166509

(51) Int. Cl.
*H01L 25/18* (2006.01)
*H01L 23/00* (2006.01)
*H01L 23/498* (2006.01)

(52) U.S. Cl.
CPC ........ *H01L 25/18* (2013.01); *H01L 23/49811* (2013.01); *H01L 24/32* (2013.01); *H01L 24/48* (2013.01); *H01L 24/49* (2013.01); *H01L 24/73* (2013.01); *H01L 24/83* (2013.01); *H01L 23/49866* (2013.01); *H01L 2224/26175* (2013.01); *H01L 2224/32225* (2013.01); *H01L 2224/48137* (2013.01); *H01L 2224/48225* (2013.01); *H01L 2224/49175* (2013.01); *H01L 2224/73265* (2013.01); *H01L 2224/83455* (2013.01); *H01L 2224/83815* (2013.01)

(58) Field of Classification Search
CPC ............ H01L 2224/03013; H01L 2224/26175
See application file for complete search history.

(56) References Cited

U.S. PATENT DOCUMENTS

| | | | |
|---|---|---|---|
| 2013/0020725 A1 | 1/2013 | Onishi et al. | |
| 2013/0026655 A1* | 1/2013 | Lee | H01L 23/13 |
| | | | 257/777 |
| 2014/0317896 A1 | 10/2014 | Maruyama et al. | |
| 2015/0221841 A1* | 8/2015 | Yokokawa | F21V 23/005 |
| | | | 362/382 |

FOREIGN PATENT DOCUMENTS

| | | |
|---|---|---|
| JP | H01293557 A | 11/1989 |
| JP | 2000286289 A | 10/2000 |
| JP | 2014187179 A | 10/2014 |
| WO | 2012073572 A1 | 6/2012 |

* cited by examiner

*Primary Examiner* — Yu-Hsi D Sun
(74) *Attorney, Agent, or Firm* — Rabin & Berdo, P.C.

(57) ABSTRACT

A semiconductor device, having a substrate including an insulating plate and a circuit board provided on a front surface of the insulating plate. The circuit board has a first disposition area and a second disposition area with a gap therebetween, and a groove portion, of which a longitudinal direction is parallel to the gap, formed in the gap. The semiconductor device further includes a first semiconductor chip and a second semiconductor chip located on the circuit board in the first disposition area and the second disposition area, respectively, and a blocking member located in the gap across the groove portion in parallel to the longitudinal direction in a plan view of the semiconductor device.

19 Claims, 22 Drawing Sheets

SEMICONDUCTOR DEVICE

CROSS-REFERENCE TO RELATED APPLICATION

This application is based upon and claims the benefit of priority of the prior Japanese Patent Application No. 2019-166509, filed on Sep. 12, 2019, the entire contents of which are incorporated herein by reference.

BACKGROUND OF THE INVENTION

1. Field of the Invention

The embodiments discussed herein relate to a semiconductor device.

2. Background of the Related Art

Semiconductor devices including semiconductor chips, such as an insulated gate bipolar transistor (IGBT) and a power metal oxide semiconductor field effect transistor (MOSFET), are used, for example, as power converters. Such a semiconductor device includes semiconductor chips and a ceramic circuit board over which the semiconductor chips are arranged with solder therebetween. The ceramic circuit board has an insulating plate and a plurality of circuit boards formed over the insulating plate. A semiconductor chip is arranged over one of the plurality of circuit boards with solder therebetween. Furthermore, a cylindrical contact part for fixing an external connection terminal is positioned over a determined area of the circuit board with solder therebetween. In addition, there is a semiconductor device using a metal base substrate in which a groove portion is formed in a portion of a circuit board near a position at which a semiconductor chip is welded. This groove portion is used for positioning at the time of arranging the semiconductor chip over the circuit board.

Japanese Laid-open Patent Publication No. 2014-187179
Japanese Laid-open Patent Publication No. 01-293557

In recent years, miniaturization or an increase in the capacity of a semiconductor device has been demanded. As a result, the packaging density of semiconductor chips is improved and the distance between semiconductor chips is reduced. With a semiconductor device in which semiconductor chips are disposed in close proximity, however, when semiconductor chips are disposed over a pair of disposition areas with a groove portion formed in a circuit board between and are bonded to the pair of disposition areas with solder therebetween, the solder may spread and be pressed out from the pair of disposition areas. Positions at which the semiconductor chips are disposed deviate with the spread of the solder. Furthermore, the semiconductor chips may come in contact with each other, depending on how the solder spreads. In addition, if the solder which spreads reaches the groove portion, then a void may be included in the solder. In this case, it may be that the position of a semiconductor chip will deviate and that the semiconductor chip will be disposed over the groove portion. As a result, the void exists under the semiconductor chip. The existence of the void deteriorates the heat dissipation property and the like of the semiconductor chip.

SUMMARY OF THE INVENTION

According to an aspect, there is provided a semiconductor device including a substrate including an insulating plate having a front surface, and a circuit board provided on the front surface of the insulating plate, the circuit board having a first disposition area and a second disposition area with a gap therebetween, and a groove portion, of which a longitudinal direction is parallel to the gap, formed in the gap; a first semiconductor chip located on the circuit board in the first disposition area; a second semiconductor chip located on the circuit board in the second disposition area; and a blocking member located in the gap across the groove portion in parallel to the longitudinal direction in a plan view of the semiconductor device.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described by reference to the accompanying drawings. In the following description a "front surface" or an "upper surface" indicates a surface of a semiconductor device 50 of FIG. 1 which faces upward. Similarly, an "upside" indicates the upper side of the semiconductor device 50 of FIG. 1. A "back surface" or a "lower surface" indicates a surface of the semiconductor device 50 of FIG. 1 which faces downward. Similarly, a "downside" indicates the lower side of the semiconductor device 50 of FIG. 1. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the present embodiments. For example, the "upside" or the "downside" does not always mean the vertical direction relative to the ground. That is to say, a direction indicated by the "upside" or the "downside" is not limited to the gravity direction.

First Embodiment

Figure 1:
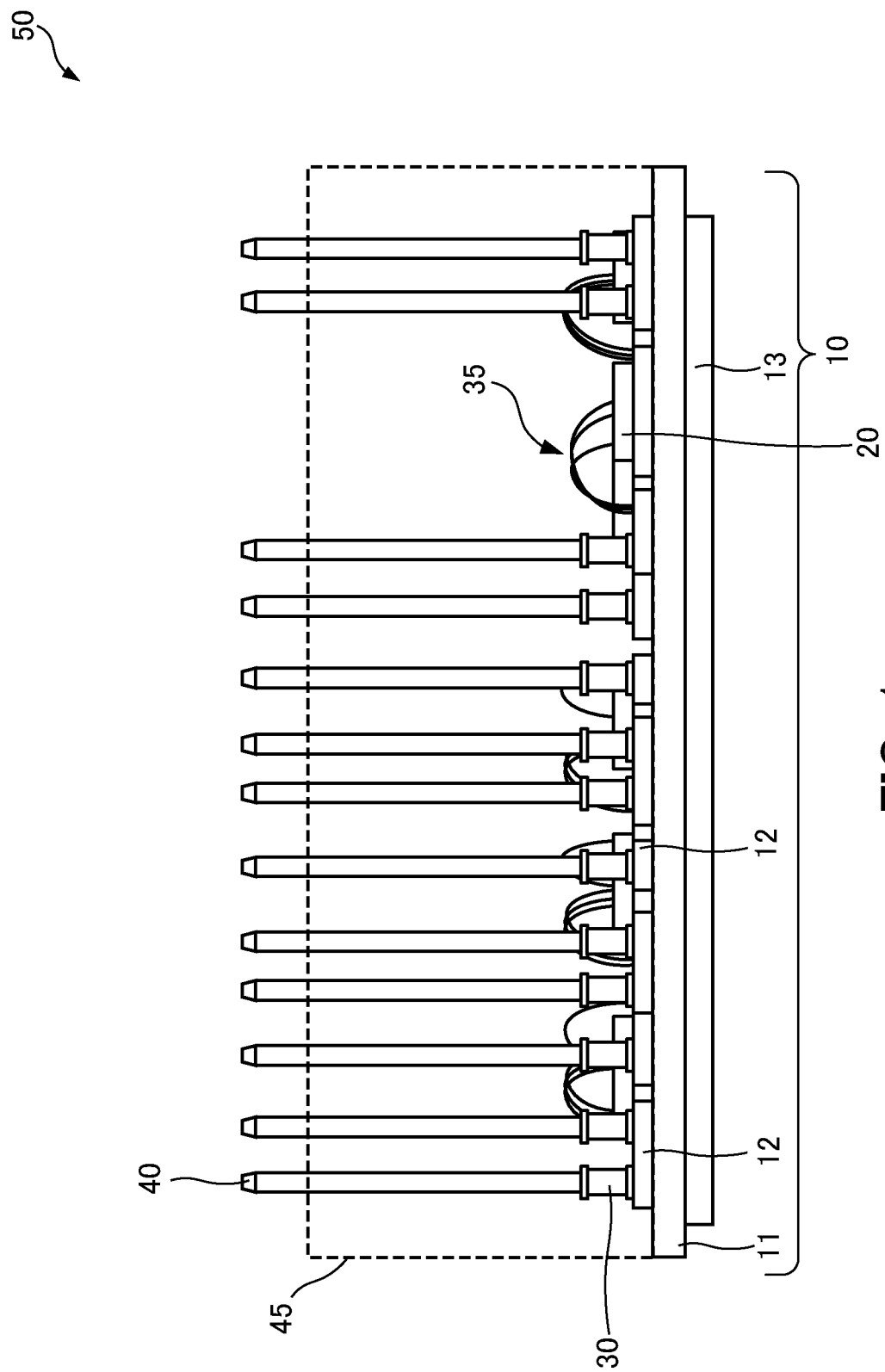
FIG. 1 is a side view illustrative of a semiconductor device according to a first embodiment.
Figure 2:
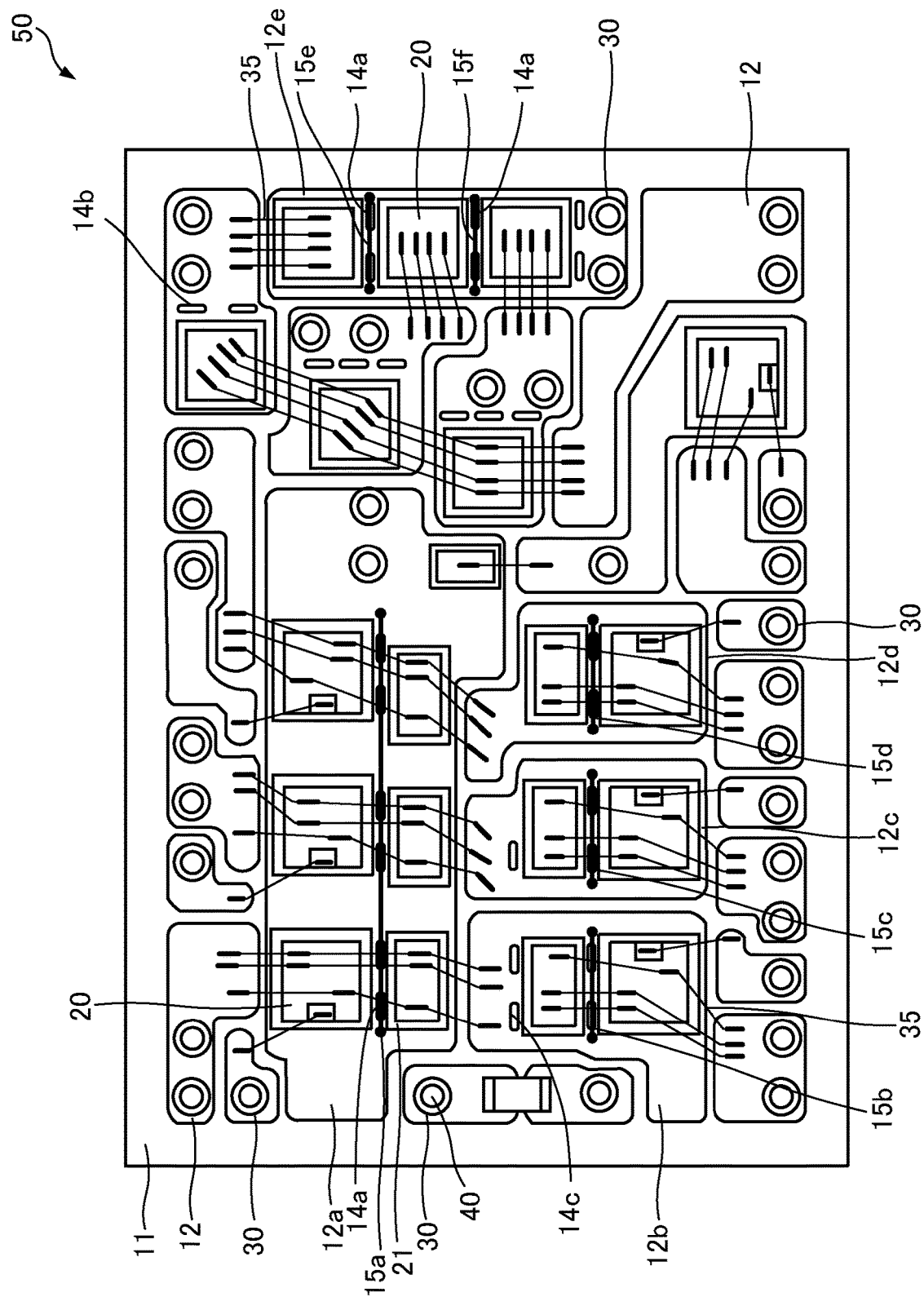
FIG. 2 is a plan view illustrative of the semiconductor device according to the first embodiment.

A semiconductor device according to a first embodiment will be described by the use of FIG. 1 and FIG. 2. FIG. 1 is a side view illustrative of the semiconductor device according to the first embodiment. FIG. 2 is a plan view illustrative of the semiconductor device according to the first embodiment. In FIG. 1, a sealing member is indicated by a dashed line. In FIG. 2, the sealing member is not illustrated. Furthermore, with the semiconductor device 50 a case which houses a ceramic circuit board 10 and the like is not illustrated. In addition, in the description of the first embodiment, a plurality of circuit boards 12, a plurality of semiconductor chips 20 and 21, a plurality of contact parts 30, a plurality of bonding wires 35, or a plurality of external connection terminals 40 are marked with the same numerals if no distinctions are made between them. In the description of the first embodiment, no distinctions are made between other components included in plurality and they are marked with the same numerals.

As illustrated in FIG. 1 and FIG. 2, the semiconductor device 50 includes a ceramic circuit board 10 (substrate) and semiconductor chips 20 and 21 bonded to the front surface of the ceramic circuit board 10. The semiconductor device 50 includes a contact part 30 bonded to the front surface of the ceramic circuit board 10. The semiconductor chips 20 and 21 and the contact part 30 are bonded to the front surface of the ceramic circuit board 10 with a bonding member (not illustrated), such as solder, therebetween. Furthermore, the semiconductor device 50 includes bonding wires 35 which electrically connect the front surface of the ceramic circuit board 10 and main electrodes of the semiconductor chips 20 and 21. In addition, an external connection terminal 40 is press-fitted into the contact part 30 for fixing. Moreover, the semiconductor device 50, together with the semiconductor chips 20 and 21 bonded to the front surface of the ceramic circuit board 10, is sealed with a sealing member 45 so that an end portion of the external connection terminal 40 press-fitted into the contact part 30 will protrude.

The ceramic circuit board 10 includes an insulating plate 11, a plurality of circuit boards 12 formed over the front surface of the insulating plate 11, and a metal plate 13 formed under the back surface of the insulating plate 11. The insulating plate 11 is made of a ceramic, such as aluminum oxide, aluminum nitride, or silicon nitride, having high thermal conductivity. The plurality of circuit boards 12 (including circuit boards 12a through 12e) are made of a material, such as copper or a copper alloy, having good electrical conductivity. Furthermore, in order to improve corrosion resistance, plating treatment or the like may be performed on the surface of each circuit board 12 by the use of nickel, a nickel alloy, or the like. A nickel alloy is preferably a nickel-phosphorus alloy, a nickel-boron alloy, or the like. The metal plate 13 is made of metal, such as aluminum, iron, silver, copper, or an alloy containing at least one of them, having high thermal conductivity. In addition, a radiation plate or a cooler (not illustrated) may be formed on the back surface of the metal plate 13. For example, the insulating plate 11 is rectangular in plan view. Moreover, the metal plate 13 is rectangular in plan view and is smaller in area than the insulating plate 11 in plan view. The area of the metal plate 13 is larger than the total area of the circuit boards 12 in plan view. Therefore, for example, the ceramic circuit board 10 is rectangular.

Groove portions 14 are properly formed in the circuit boards 12. The groove portions 14 include a groove portion 14a between the semiconductor chips 20 and 21. The groove portion 14a is formed in a gap between disposition areas of a circuit board 12 over which the semiconductor chips 20 and 21 are disposed, and its longitudinal direction is parallel to the semiconductor chips 20 and 21 (disposition areas). Furthermore, the groove portions 14 include a groove portion 14b formed between the disposition area over which the semiconductor chip 20 or 21 is disposed and an area over which a terminal, such as the contact part 30, or an electronic part, such as a capacitor or a resistor, is disposed. In addition, the groove portions 14 include a groove portion 14c formed between the disposition area over which the semiconductor chip 20 or 21 is disposed and an area to which the bonding wire 35 is bonded. These groove portions 14 (as which the groove portions 14a, 14b, and 14c are generically named) are not in contact with the edges of the circuit boards 12 in plan view and are independently formed in the planes of the circuit boards 12. Moreover, the groove portions 14 are formed so as to pierce the circuit boards 12 in the thickness direction. The length in the lateral direction of the groove portions 14 is, for example, greater than or equal to 100 µm and smaller than or equal to 1.0 mm and is preferably greater than or equal to 400 µm and smaller than or equal to 500 µm. The length in the longitudinal direction of the groove portions 14 is arbitrarily set at need. The details of the groove portions 14 will be described later.

Furthermore, bonding wires 15a through 15f are located as blocking members over the groove portions 14 in the circuit boards 12a through 12e. Blocking members are located over the groove portions 14a between the semiconductor chips 20 and 21. Blocking members may be located over the groove portions 14b or 14c. However, it is desirable not to locate blocking members over the groove portions 14b or 14c. For example, if blocking members are located over the groove portions 14b, then a soldering jig is not properly disposed at the time of solder-bonding the contact parts 30. In addition, if blocking members are located over the groove portions 14c, then bonding of the bonding wire 35 for electrical wiring may be disturbed by the blocking members. In the first embodiment a case where blocking members are located over the groove portions 14a between the semiconductor chips 20 and 21 will be described. However, the following case is possible. Groove portions are formed between three or more semiconductor chips and blocking members are located over the groove portions in the same way that is described in the first embodiment.

For example, the above bonding wires 15a through 15f are thin lines having a diameter larger than or equal to 125 µm and smaller than or equal to 400 µm. For example, the bonding wires 15a through 15f are made of aluminum, nickel, iron, an alloy containing at least one of them, or the like. In particular, it is desirable that the solder wettability of metal of which the bonding wires 15a through 15f are made be lower than that of the surfaces of the circuit boards 12a through 12e. For example, if the surfaces of the circuit boards 12a through 12e are made of copper or a copper alloy, then the bonding wires 15a through 15f may be made of aluminum, nickel, iron, an alloy containing at least one of them, or the like. In addition, for example, if nickel or a nickel alloy is formed on the surfaces of the circuit boards 12a through 12e, then the bonding wires 15a through 15f may be made of aluminum, an aluminum alloy, or the like. The details of the bonding wires 15a through 15f will be described later.

A direct copper bonding (DCB) substrate, an active metal brazed (AMB) substrate, or the like may be used as the ceramic circuit board 10 having the above structure. Furthermore, as stated above, a cooler (not illustrated) may be fixed on the metal plate 13 of the ceramic circuit board 10 with thermal grease, such as silicone, with which a metal oxide filler is mixed therebetween in order to improve the heat dissipation property. In this case, the cooler is made of aluminum, iron, silver, copper, an alloy containing at least one of them, or the like having high thermal conductivity. In addition, a fin, a heat sink made up of a plurality of fins, a water-cooling cooler, or the like may be used as the cooler.

The semiconductor chip 20 includes a switching element, such as an IGBT or a power MOSFET, made of silicon or silicon carbide. For example, the semiconductor chip 20 has a drain electrode (or a collector electrode) as a main electrode on the back surface and has a gate electrode and a source electrode (or an emitter electrode) as main electrodes on the front surface. Furthermore, the semiconductor chip 21 includes a diode such as a Schottky barrier diode (SBD) or a freewheeling diode (FWD). In this case, the semiconductor chip 21 has a cathode electrode as a main electrode on the back surface and has an anode electrode as a main electrode on the front surface. The back surfaces of the above semiconductor chips 20 and 21 are bonded to the determined circuit boards (not illustrated). The semiconductor chips 20 and 21 are bonded to the circuit boards 12 with solder (not illustrated) therebetween. The solder will be described later. In addition, reverse-conducting (RC)-IGBTs (not illustrated) having the function of an IGBT and the function of an FWD may be used in place of the semiconductor chips 20 and 21. Moreover, lead frames, external connection terminals (pin terminals, contact parts, or the like), electronic parts (thermistors or current sensors), or the like may be disposed at need in place of the semiconductor chips 20 and 21. For example, the thicknesses of the semiconductor chips 20 and 21 are greater than or equal to 180 µm and smaller than or equal to 220 µm and average about 200 µm.

The bonding wires 35 connect the semiconductor chips 20 and 21 and the circuit boards 12 or a plurality of semiconductor chips 20 and 21 electrically and properly. The bonding wires 35 are made of a material, such as gold, silver, copper, aluminum, or an alloy containing at least one of them, having good electrical conductivity. Furthermore, part of the bonding wires 35 have a diameter, for example, larger than or equal to 110 µm and smaller than or equal to 200 µm. The other bonding wires 35 have a diameter, for example, larger than or equal to 350 µm and smaller than or equal to 500 µm.

For example, the sealing member 45 may be silicone gel. In addition, for example, a thermosetting resin, such as epoxy resin, phenolic resin, or maleimide resin, or a filler contained in a thermosetting resin may be used. An example of the sealing member 45 is epoxy resin or a filler such as silicon dioxide, aluminum oxide, boron nitride, or aluminum nitride contained in epoxy resin.

Figure 3:
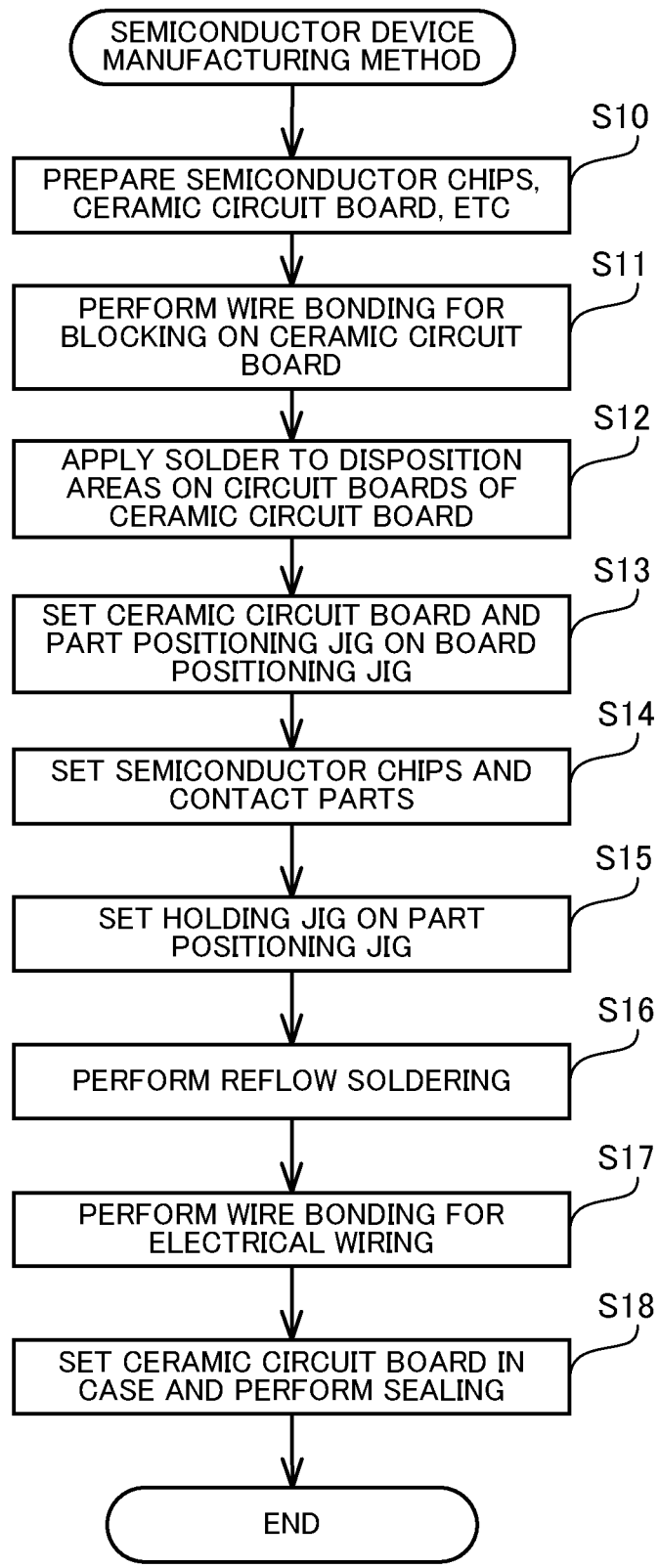
FIG. 3 is a flow chart illustrative of a method for manufacturing the semiconductor device according to the first embodiment.
Figure 4:
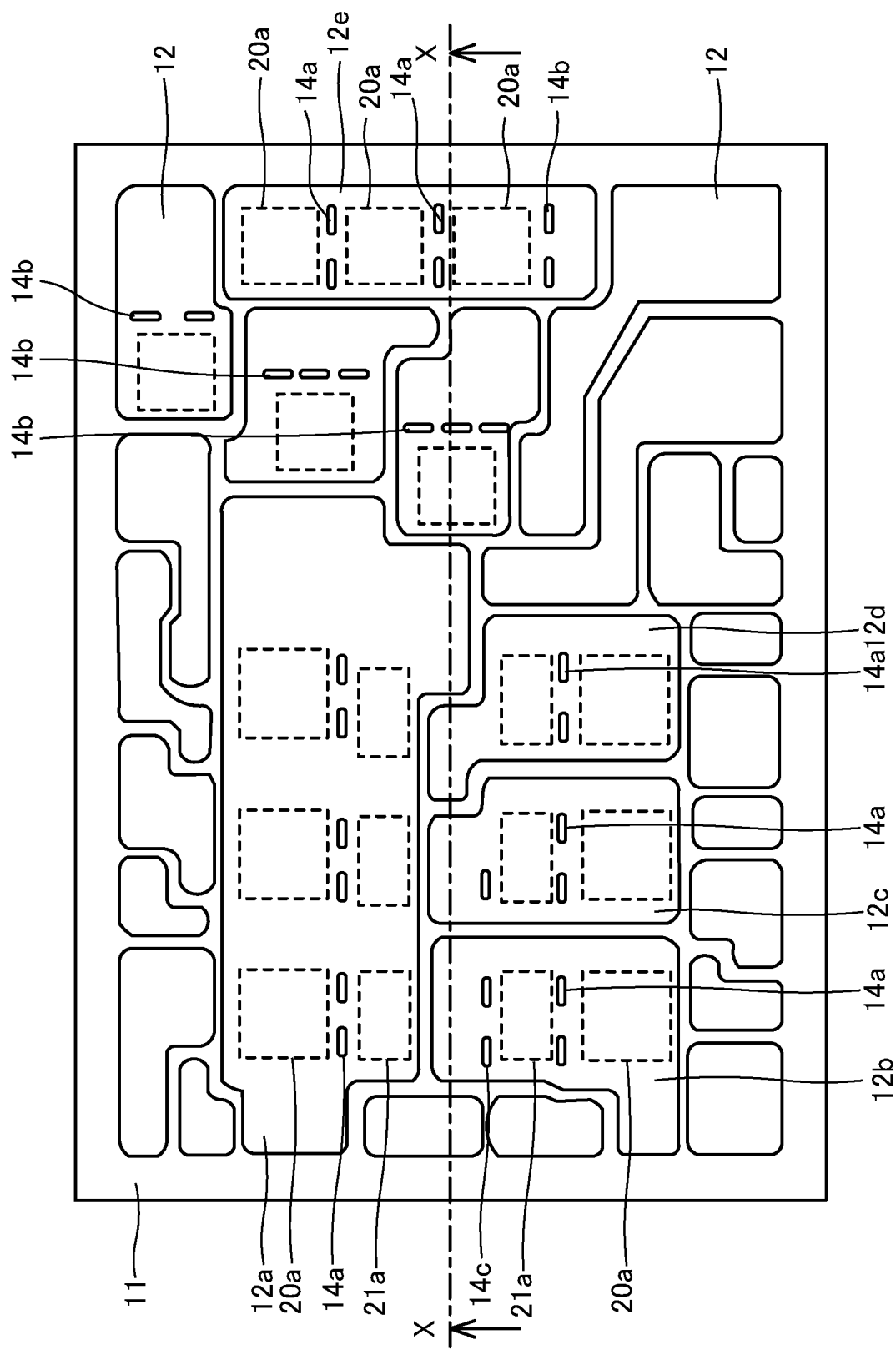
FIG. 4 is a plan view for describing a ceramic circuit board used in the method for manufacturing the semiconductor device according to the first embodiment.
Figure 5:
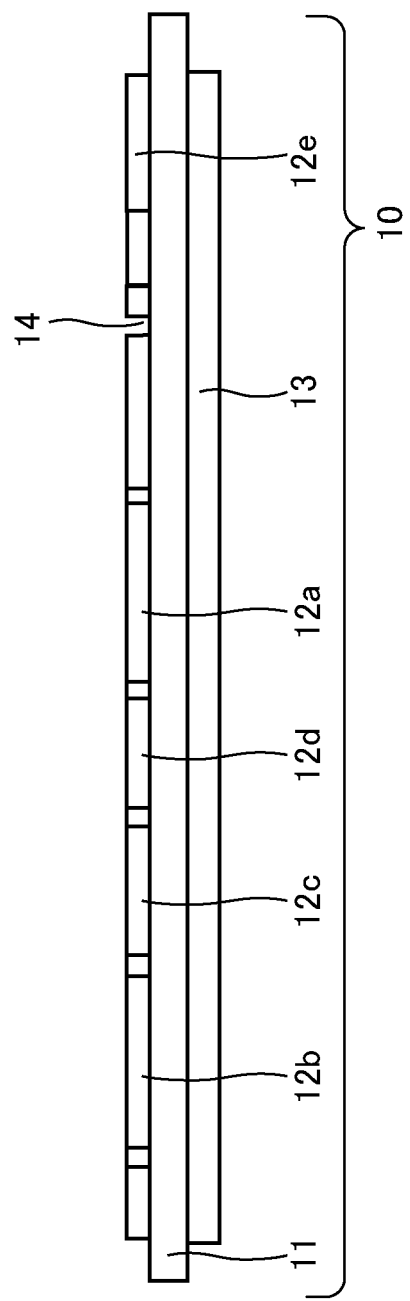
FIG. 5 is a sectional view for describing the ceramic circuit board used in the method for manufacturing the semiconductor device according to the first embodiment.

A method for manufacturing the above semiconductor device 50 will now be described in accordance with a flow chart illustrated in FIG. 3 by the use of FIGS. 4 through 14 which illustrate steps and jigs. FIG. 3 is a flow chart illustrative of a method for manufacturing the semiconductor device according to the first embodiment. FIG. 4 is a plan view for describing the ceramic circuit board used in the method for manufacturing the semiconductor device according to the first embodiment. FIG. 5 is a sectional view for describing the ceramic circuit board used in the method for manufacturing the semiconductor device according to the first embodiment.

Figure 6:
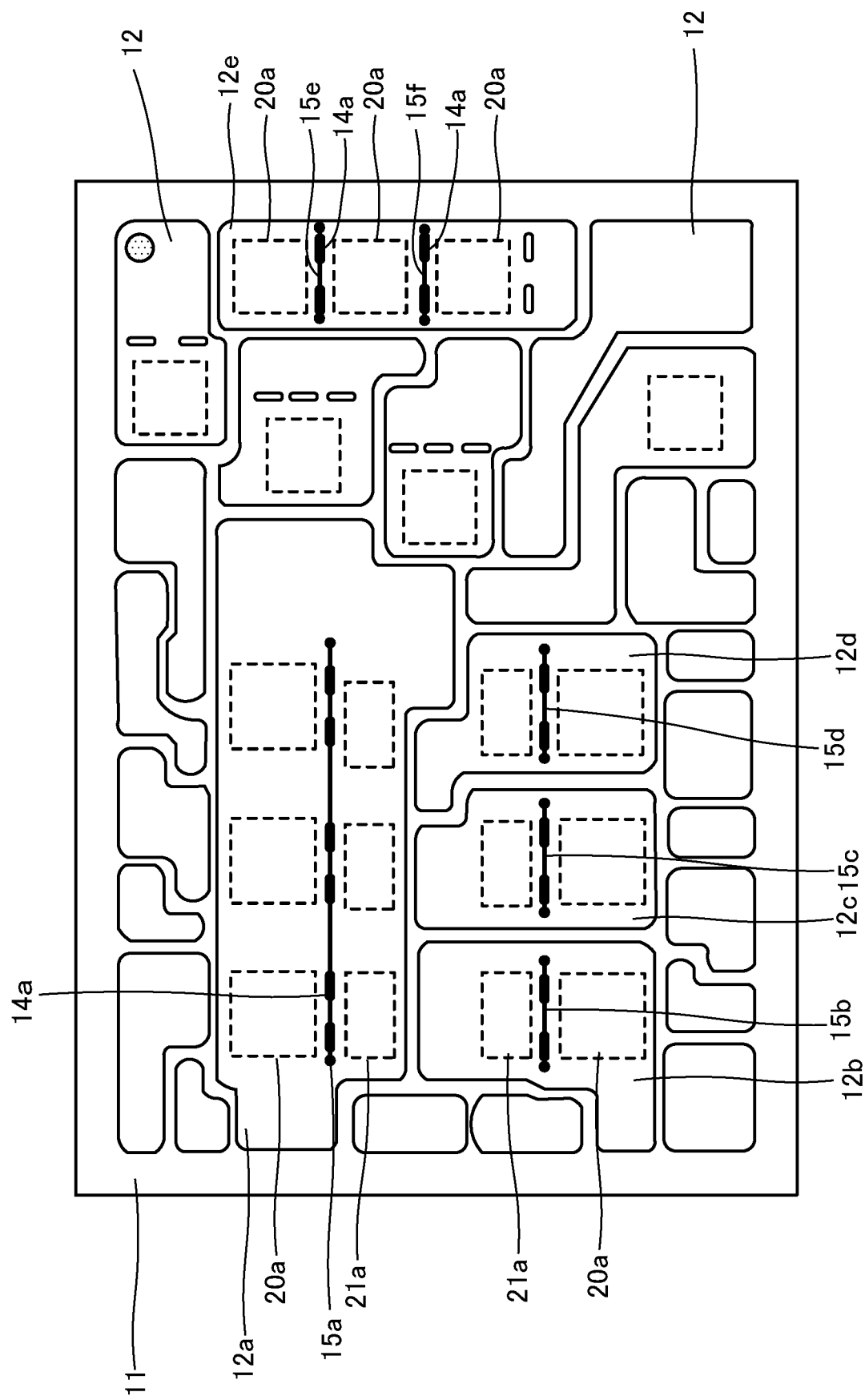
FIG. 6 is a plan view for describing a process for performing wire bonding on the ceramic circuit board in the method for manufacturing the semiconductor device according to the first embodiment.
Figure 7:
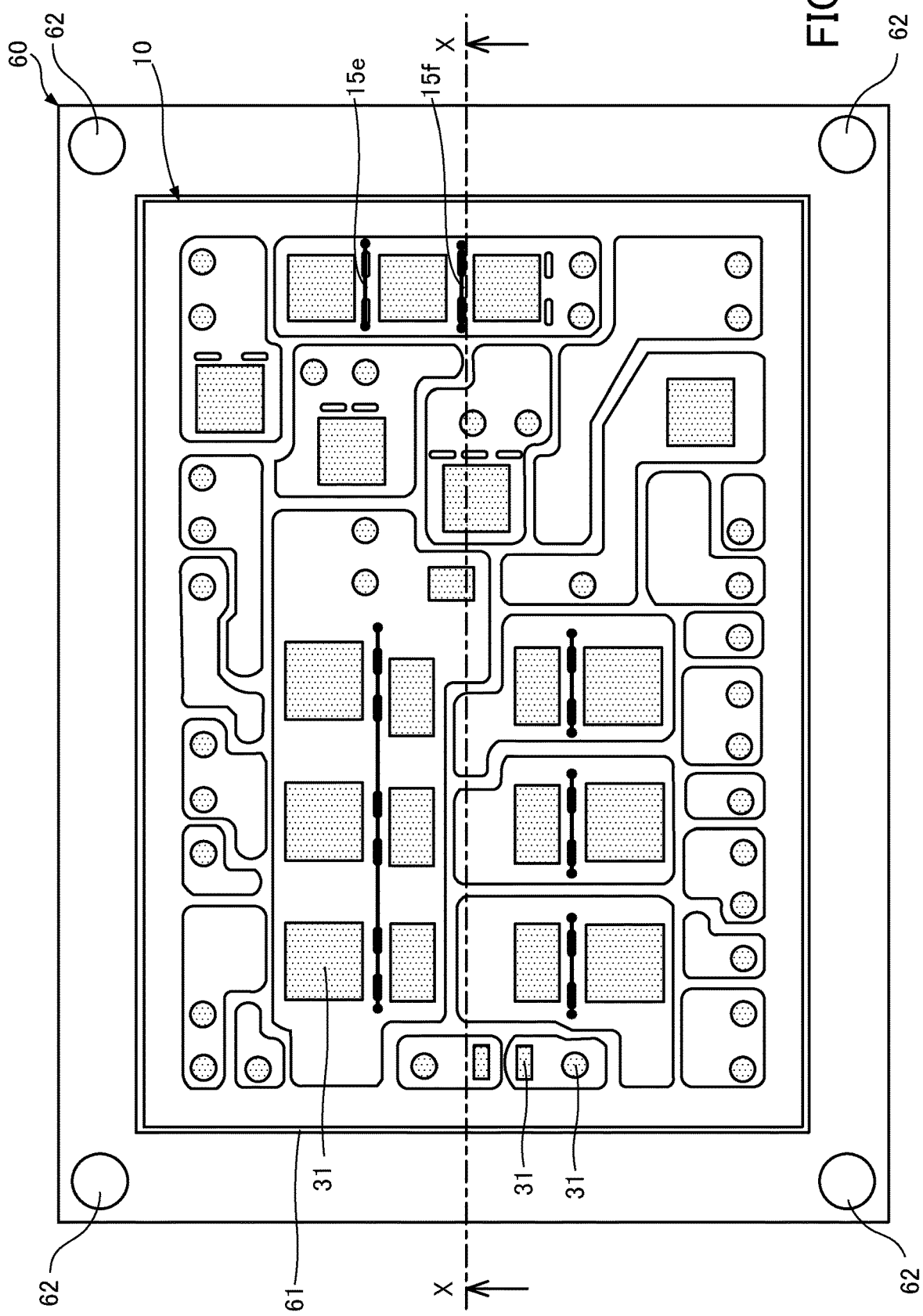
FIG. 7 is a plan view for describing a process for setting the ceramic circuit board on a board positioning jig in the method for manufacturing the semiconductor device according to the first embodiment.
Figure 8:
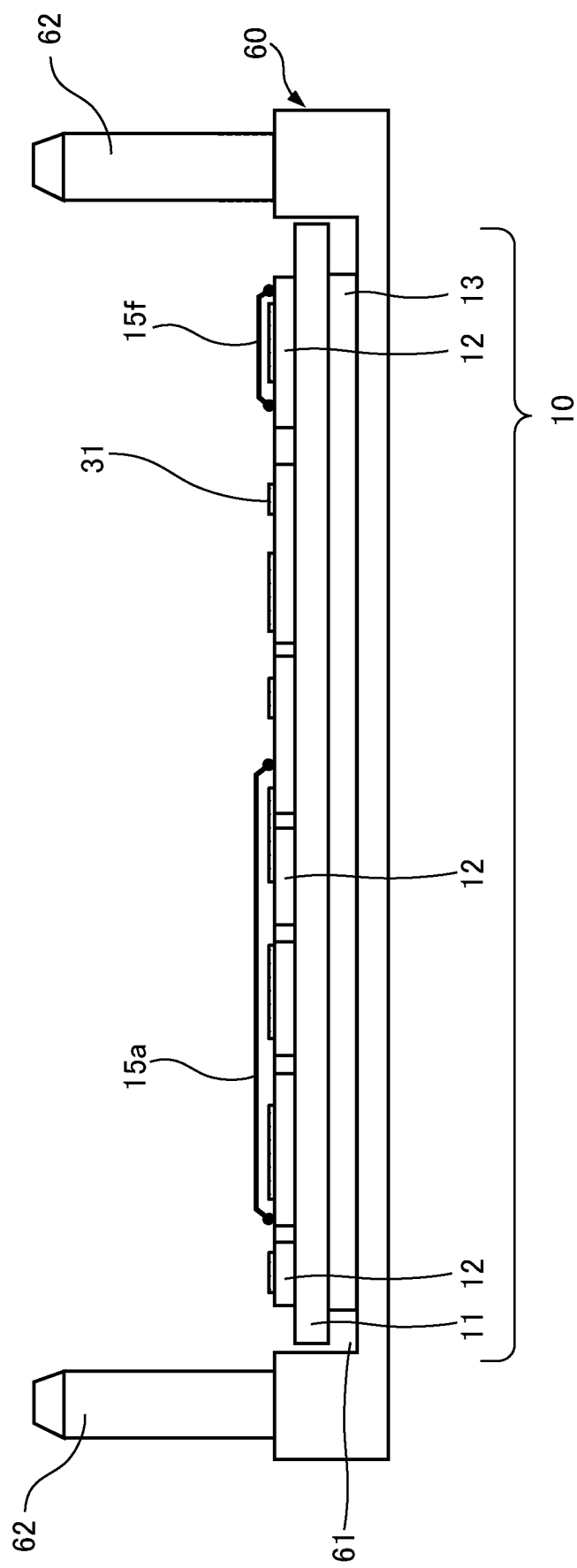
FIG. 8 is a sectional view for describing the process for setting the ceramic circuit board on the board positioning jig in the method for manufacturing the semiconductor device according to the first embodiment.

FIG. 6 is a plan view for describing a process for performing wire bonding on the ceramic circuit board in the method for manufacturing the semiconductor device according to the first embodiment. FIG. 7 is a plan view for describing a process for setting the ceramic circuit board on a board positioning jig in the method for manufacturing the semiconductor device according to the first embodiment. FIG. 8 is a sectional view for describing the process for setting the ceramic circuit board on the board positioning jig in the method for manufacturing the semiconductor device according to the first embodiment.

Figure 9:
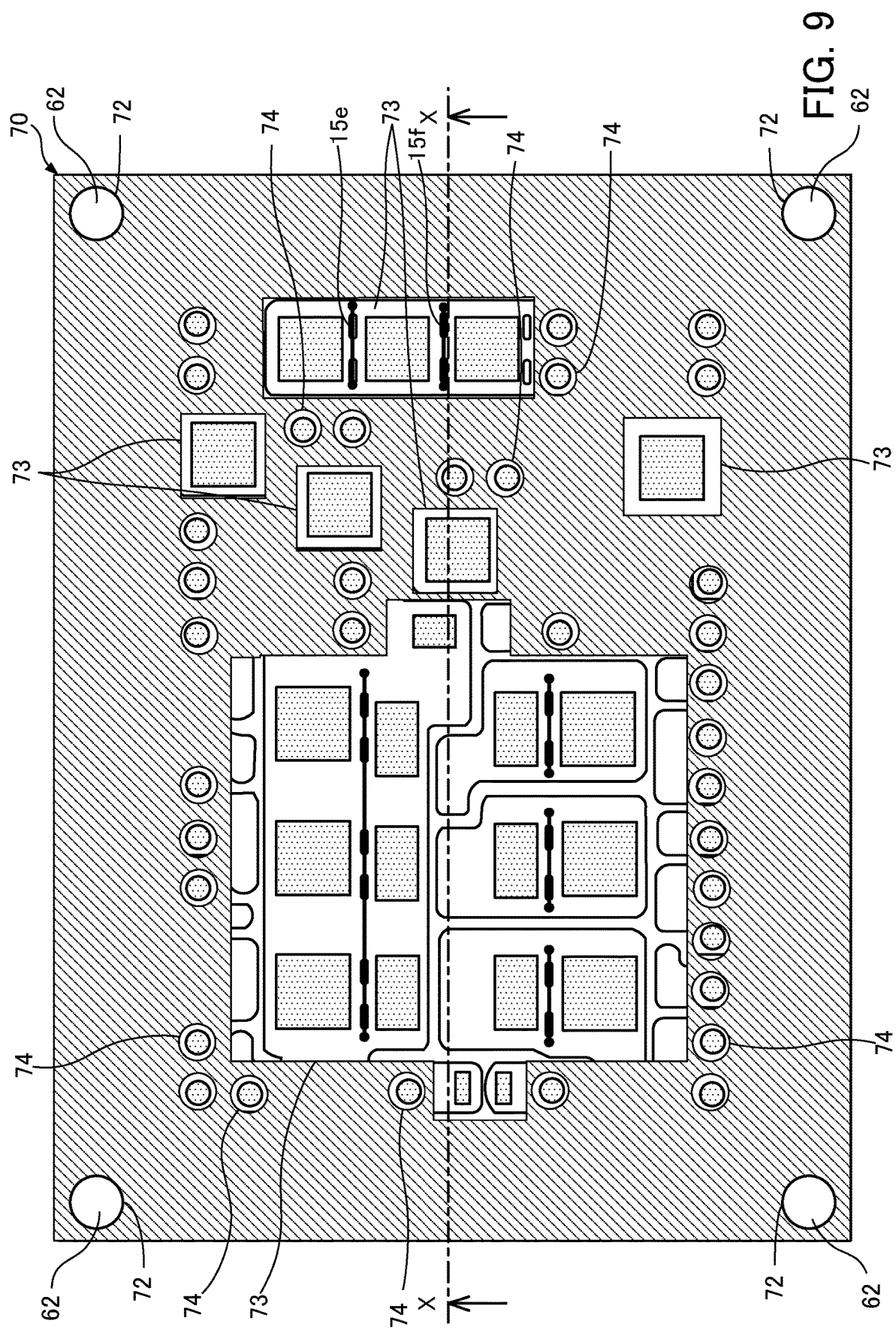
FIG. 9 is a plan view for describing a process for setting a part positioning jig in the method for manufacturing the semiconductor device according to the first embodiment.
Figure 10:
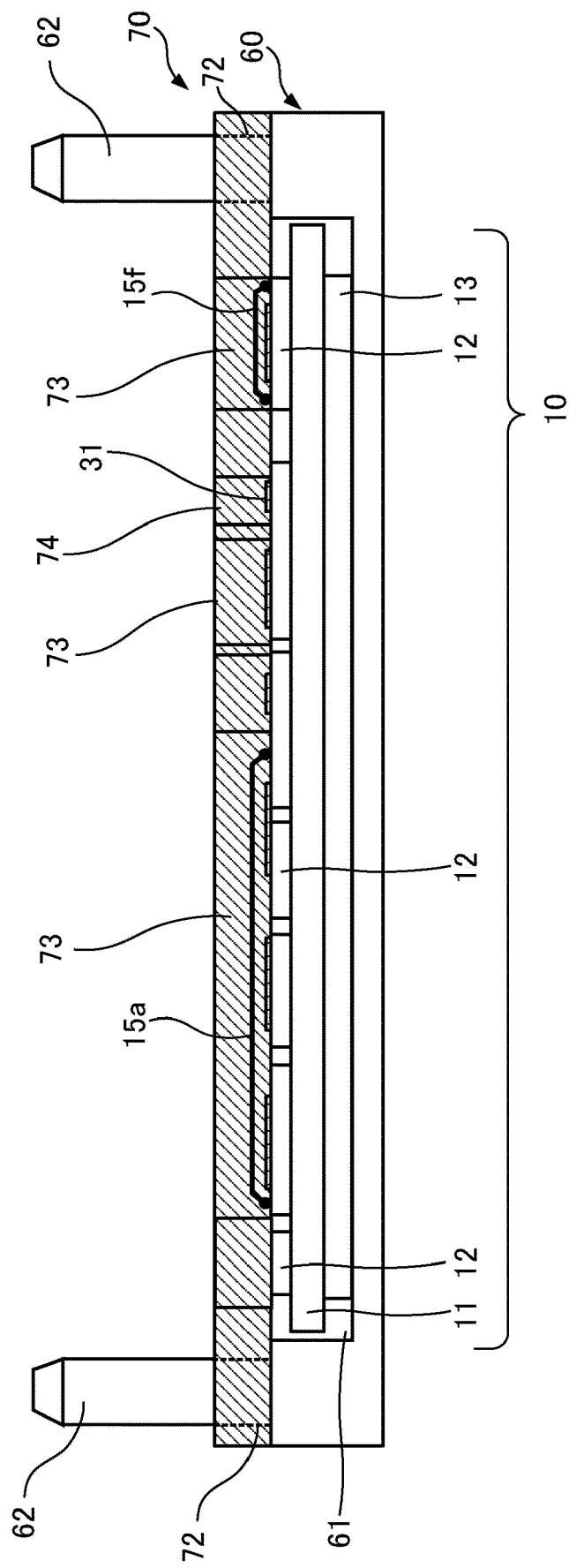
FIG. 10 is a sectional view for describing the process for setting the part positioning jig in the method for manufacturing the semiconductor device according to the first embodiment.
Figure 11:
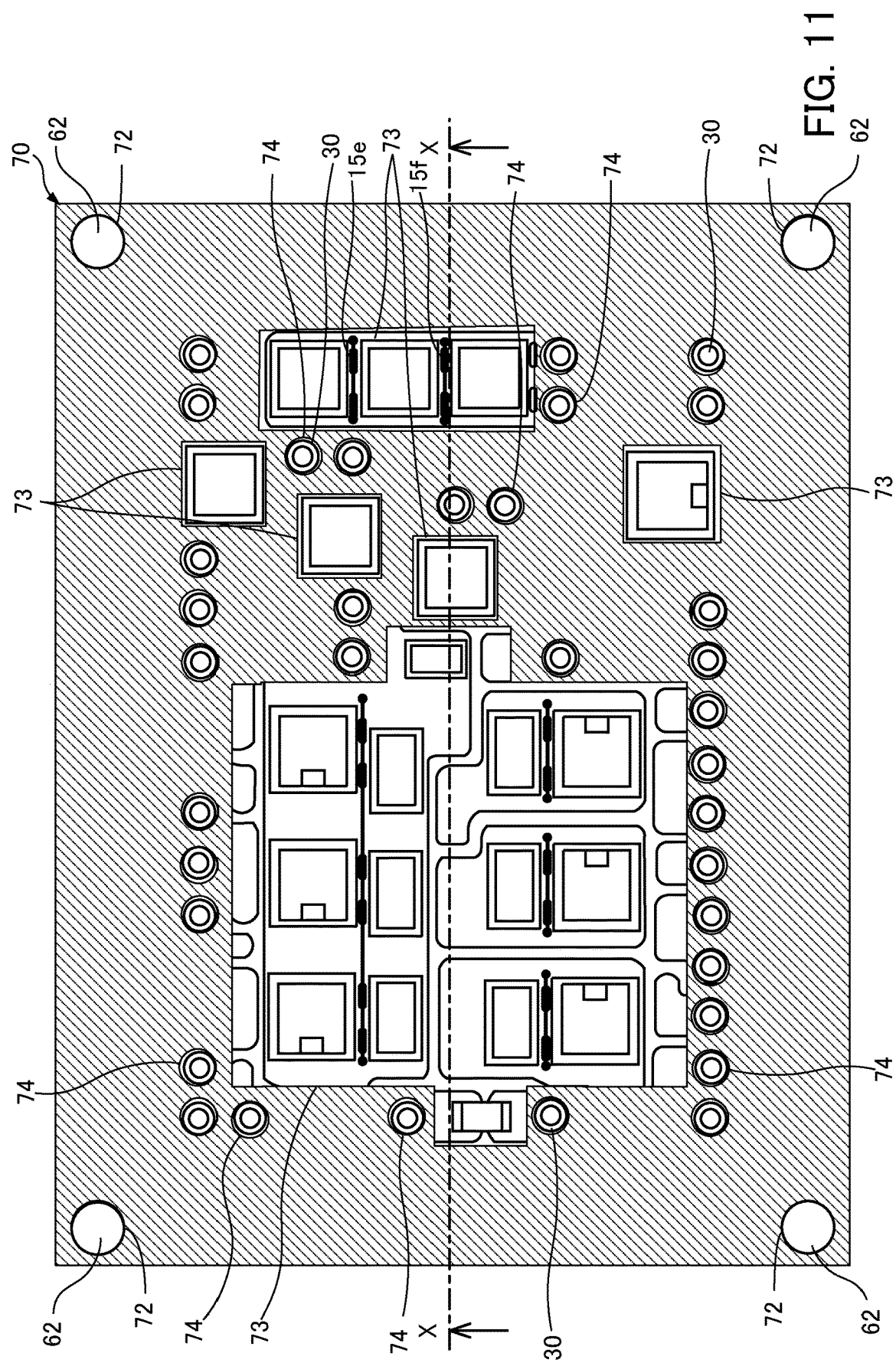
FIG. 11 is a plan view for describing a process for setting a contact part by the use of the part positioning jig in the method for manufacturing the semiconductor device according to the first embodiment.
Figure 12:
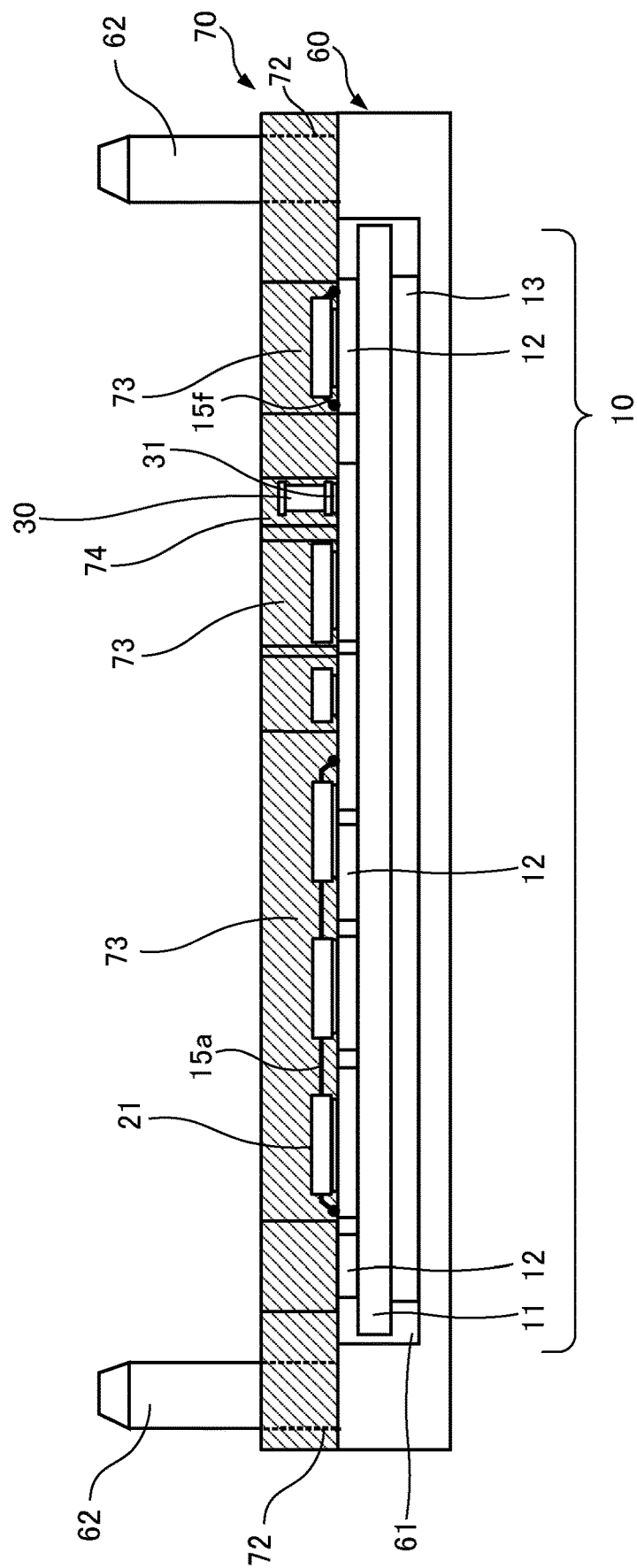
FIG. 12 is a sectional view for describing the process for setting the contact part by the use of the part positioning jig in the method for manufacturing the semiconductor device according to the first embodiment.
Figure 13:
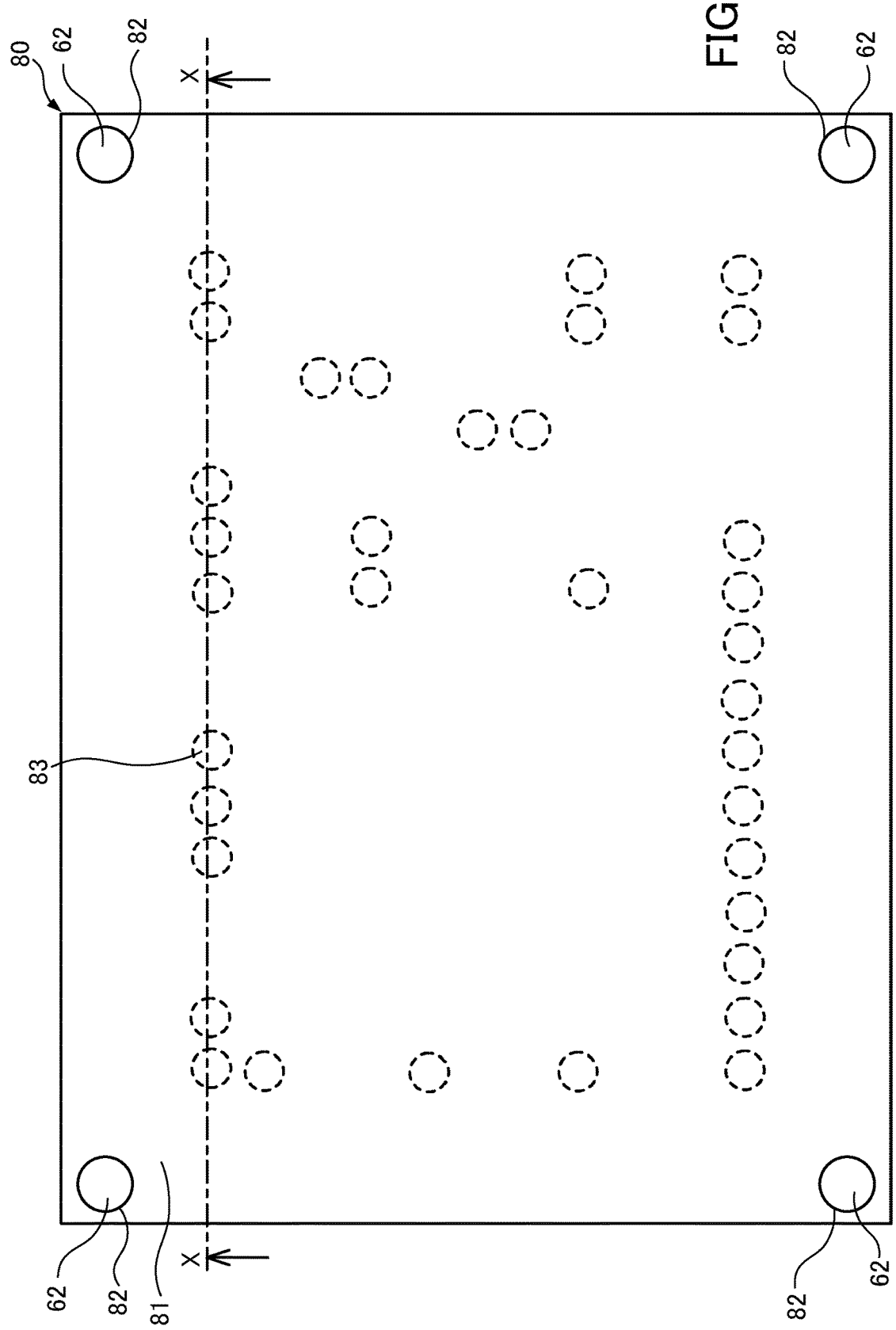
FIG. 13 is a plan view for describing a process for setting a holding jig in the method for manufacturing the semiconductor device according to the first embodiment.
Figure 14:
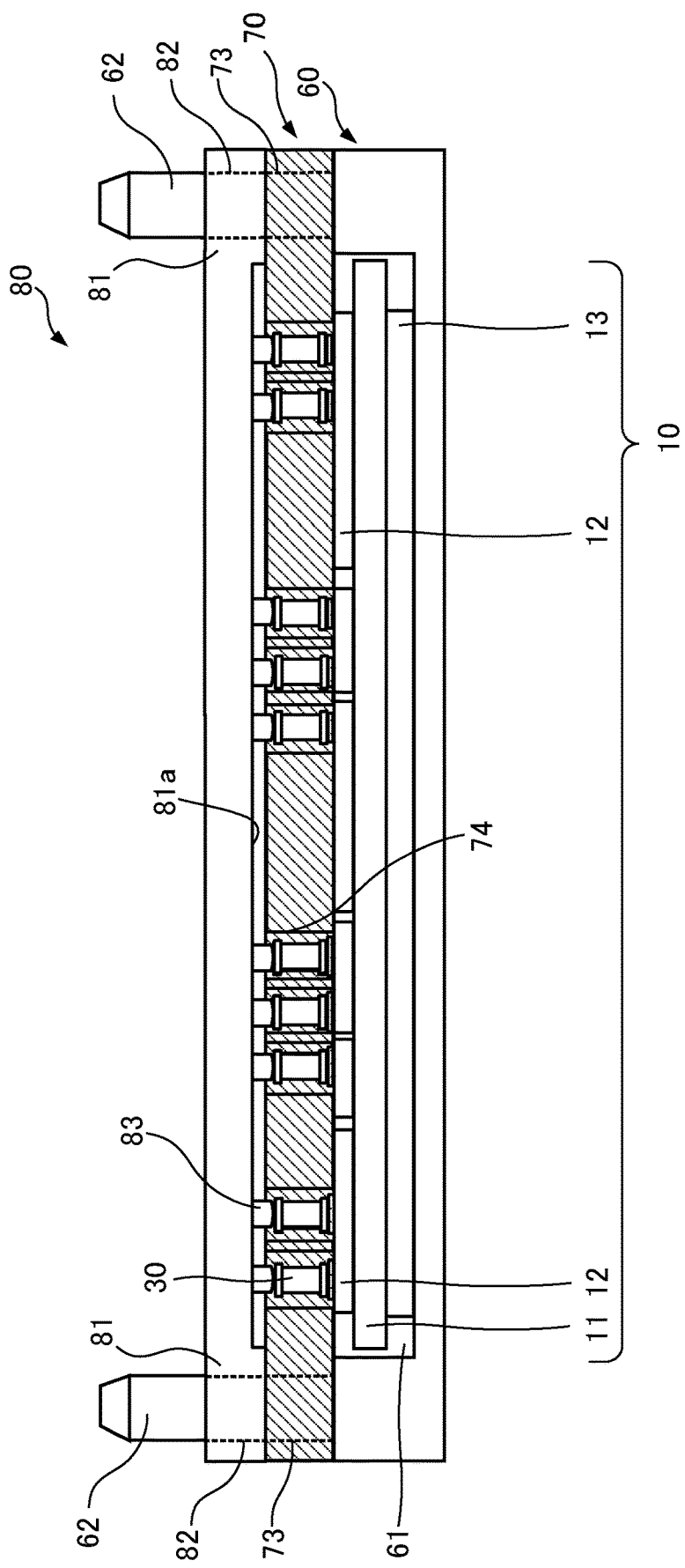
FIG. 14 is a sectional view for describing the process for setting the holding jig in the method for manufacturing the semiconductor device according to the first embodiment.

FIG. 9 is a plan view for describing a process for setting a part positioning jig in the method for manufacturing the semiconductor device according to the first embodiment. FIG. 10 is a sectional view for describing the process for setting the part positioning jig in the method for manufacturing the semiconductor device according to the first embodiment. FIG. 11 is a plan view for describing a process for setting a contact part by the use of the part positioning jig in the method for manufacturing the semiconductor device according to the first embodiment. FIG. 12 is a sectional view for describing the process for setting the contact part by the use of the part positioning jig in the method for manufacturing the semiconductor device according to the first embodiment. FIG. 13 is a plan view for describing a process for setting a holding jig in the method for manufacturing the semiconductor device according to the first embodiment. FIG. 14 is a sectional view for describing the process for setting the holding jig in the method for manufacturing the semiconductor device according to the first embodiment. FIGS. 5, 8, 10, 12, and 14 are sectional views taken along the dot-dash lines X-X of FIGS. 4, 7, 9, 11, and 13 respectively.

The semiconductor device 50 is manufactured in accordance with the following processes (flow chart). The following processes are performed artificially or by the use of a manufacturing apparatus at need.

(Step S10) Semiconductor chips 20 and 21, ceramic circuit board 10, and contact parts 30 are prepared. In addition to these parts, parts and the like needed to manufacture the semiconductor device 50 are prepared in advance. As illustrated in FIGS. 4 and 5, the ceramic circuit board 10 includes an insulating plate 11, a plurality of circuit boards 12 formed over the front surface of the insulating plate 11, and a metal plate 13 formed under the back surface of the insulating plate 11. In FIG. 4, rectangular dashed lines drawn on the plurality of circuit boards 12 indicate disposition areas over which the semiconductor chips 20 and 21 are disposed later. Groove portions 14 are formed close to the disposition areas. For example, a couple of disposition areas 20*a* and 21*a* are set with a gap therebetween parallel to the gap on each of the circuit boards 12*a* through 12*d*. The groove portions 14 whose longitudinal direction is parallel to the gaps are formed in the gaps. The groove portions 14 function as registration at the time of applying solder later to the disposition areas 20*a* and 21*a*.

(Step S11) As illustrated in FIG. 6, the groove portions 14 are formed in plan view in the gaps between the disposition areas 20*a* and 21*a* on the circuit boards 12*a* through 12*d* of the circuit boards 12 of the ceramic circuit board 10. Bonding wires 15*a* through 15*d* are located across the groove portions 14 in the longitudinal direction. As stated above, the bonding wires 15*a* through 15*d* are located over groove portions 14*a* between the semiconductor chips 20 and 21. Furthermore, at this time, groove portions 14*a* are also formed in gaps between disposition areas 20*a* of the semiconductor chips 20 on a circuit board 12*e* and bonding wires 15*e* and 15*f* are located across the groove portions 14*a* in the longitudinal direction. Bonding wires may be located across other groove portions 14*b* or 14*c*. However, it is desirable not to locate bonding wires across the groove portions 14*b* or 14*c*.

(Step S12) Solder 31 is applied to disposition areas of the semiconductor chips 20 and 21 and the contact parts 30 on the circuit boards 12 of the ceramic circuit board 10 (see FIG. 7). For example, the solder 31 may be applied to the disposition areas on the circuit boards 12 of the ceramic circuit board 10 by the use of a dispenser. A solder chip (not illustrated) may be disposed on each disposition area. In FIG. 7, the solder 31 applied to the disposition areas of the semiconductor chips 20 and 21 is indicated by squares and the solder 31 applied to the disposition areas of the contact parts 30 is indicated by circles.

Furthermore, for example, the above solder 31 is Pb-free solder containing at least one of a tin-silver-copper alloy, a tin-zinc-bismuth alloy, a tin-copper alloy, and a tin-silver-indium-bismuth alloy as a main ingredient. In addition, the solder 31 contains flux having the function of removing oxide on the circuit boards 12. For example, the flux contains epoxy resin, carboxylic acid, rosin resin, an activator, or a solvent and may contain another ingredient at need. Moreover, the solder 31 may contain an additive such as nickel, germanium, cobalt, or silicon.

Step S11 and step s12 may be performed in the reverse order. If step S12 is performed before step S11, then the application of the solder 31 is not disturbed by the bonding wires 15*a* through 15*f*. For example, at this time the application of the solder 31 may be performed by screen printing.

(Step S13) As illustrated in FIGS. 7 and 8, the ceramic circuit board 10 over which the bonding wires 15*a* through 15*f* are located in this way and over which the solder 31 is applied is set on a board positioning jig 60. The board positioning jig 60 is rectangular in plan view. A concave housing section 61 in which the ceramic circuit board 10 is housed is formed in the center of the board positioning jig 60. Furthermore, guide pins 62 are formed at the four corners of the upper surface of the board positioning jig 60. In addition, the board positioning jig 60 is made of a highly heat-resistant material such as a composite ceramic material or carbon. The ceramic circuit board 10 is placed on the housing section 61 of the board positioning jig 60 with the circuit boards 12 up.

Furthermore, as illustrated in FIGS. 9 and 10, a part positioning jig 70 is set on the board positioning jig 60. The part positioning jig 70 is also made of a highly heat-resistant material such as a composite ceramic material or carbon. The part positioning jig 70 is a rectangular plate in plan view. Guide holes 72 are made at the four corners of the part positioning jig 70. The guide pins 62 of the board positioning jig 60 are inserted into the guide holes 72 to set the part positioning jig 70 on the board positioning jig 60. In addition, element guide portions 73 and contact guide portions 74 are formed in the part positioning jig 70 by forming openings in the part positioning jig 70. As stated above, when the part positioning jig 70 is set on the board positioning jig 60, the element guide portions 73 and the contact guide portions 74 are opposed to the disposition areas (solder 31 applied thereto) of the semiconductor chips 20 and 21 and the contact parts 30, respectively, on the circuit boards 12 of the ceramic circuit board 10. The size of the element guide portions 73 and the contact guide portions 74 formed are a size larger than that of the semiconductor chips 20 and 21 and the contact parts 30 respectively.

(Step S14) As illustrated in FIGS. 11 and 12, the semiconductor chips 20 and 21 and the contact parts 30 are set by a mounting apparatus (not illustrated) on the solder 31 applied in step S12 in the element guide portions 73 and the contact guide portions 74 of the part positioning jig 70.

(Step S15) As illustrated in FIGS. 13 and 14, a holding jig 80 is set on the part positioning jig 70. The holding jig 80 is also made of a highly heat-resistant material such as a composite ceramic material or carbon. The holding jig 80 has a flat plate portion 81, guide holes 82, and pressing portions 83. As illustrated in FIG. 13, the flat plate portion 81 has a shape corresponding to the part positioning jig 70 in plan view. The guide holes 82 are made at the four corners of the flat plate portion 81. The pressing portions 83 are formed on a principal plane 81*a* of the flat plate portion 81 on the side of the part positioning jig 70 so as to correspond to the contact guide portions 74 of the part positioning jig 70. When the holding jig 80 is set on the part positioning jig 70 by inserting the guide pins 62 into the guide holes 82, the pressing portions 83 enter the contact guide portions 74 of the part positioning jig 70 and come in contact with the contact parts 30.

(Step S16) The ceramic circuit board 10 is carried in a reflow furnace in a state in which the holding jig 80 is set in step S15, pressure in the reflow furnace is reduced, and heating treatment is performed at reflow treatment temperature (reflow soldering step). For example, the reflow treatment temperature is higher than or equal to 250° C. and lower than or equal to 300° C. By doing so, the solder 31 melts and the semiconductor chips 20 and 21 and the contact parts 30 are connected electrically and mechanically to the circuit boards 12. Furthermore, the molten solder 31 solidifies. As a result, the semiconductor chips 20 and 21 and the contact parts 30 are bonded to the circuit boards 12. The state of the semiconductor chips 20 and 21 bonded in this way to the circuit boards 12 of the ceramic circuit board 10 and the state of the solder 31 will be described later.

The holding jig 80 and the part positioning jig 70 are removed in order and the ceramic circuit board 10 having the circuit boards 12 to which the semiconductor chips 20 and 21 and the contact parts 30 are bonded is taken out of the board positioning jig 60. Furthermore, determined area on the circuit boards 12 of the ceramic circuit board 10 and the semiconductor chips 20 and 21 are electrically connected with bonding wires by the use of an ultrasonic bonding tool (not illustrated). In addition, after the bonding wires 35 are formed in this way, external connection terminals (not illustrated) are press-fitted into the contact parts 30.

(Step S18) The semiconductor chips 20 and 21 and the contact parts 30 are bonded to the circuit boards 12 of the ceramic circuit board 10. The determined area on the circuit boards 12 of the ceramic circuit board 10 and the semiconductor chips 20 and 21 are electrically connected with the bonding wires 35. This ceramic circuit board 10 is set in a case and is sealed with a sealing member 45. As a result, the semiconductor device 50 illustrated in FIGS. 1 and 2 is manufactured.

Figure 15:
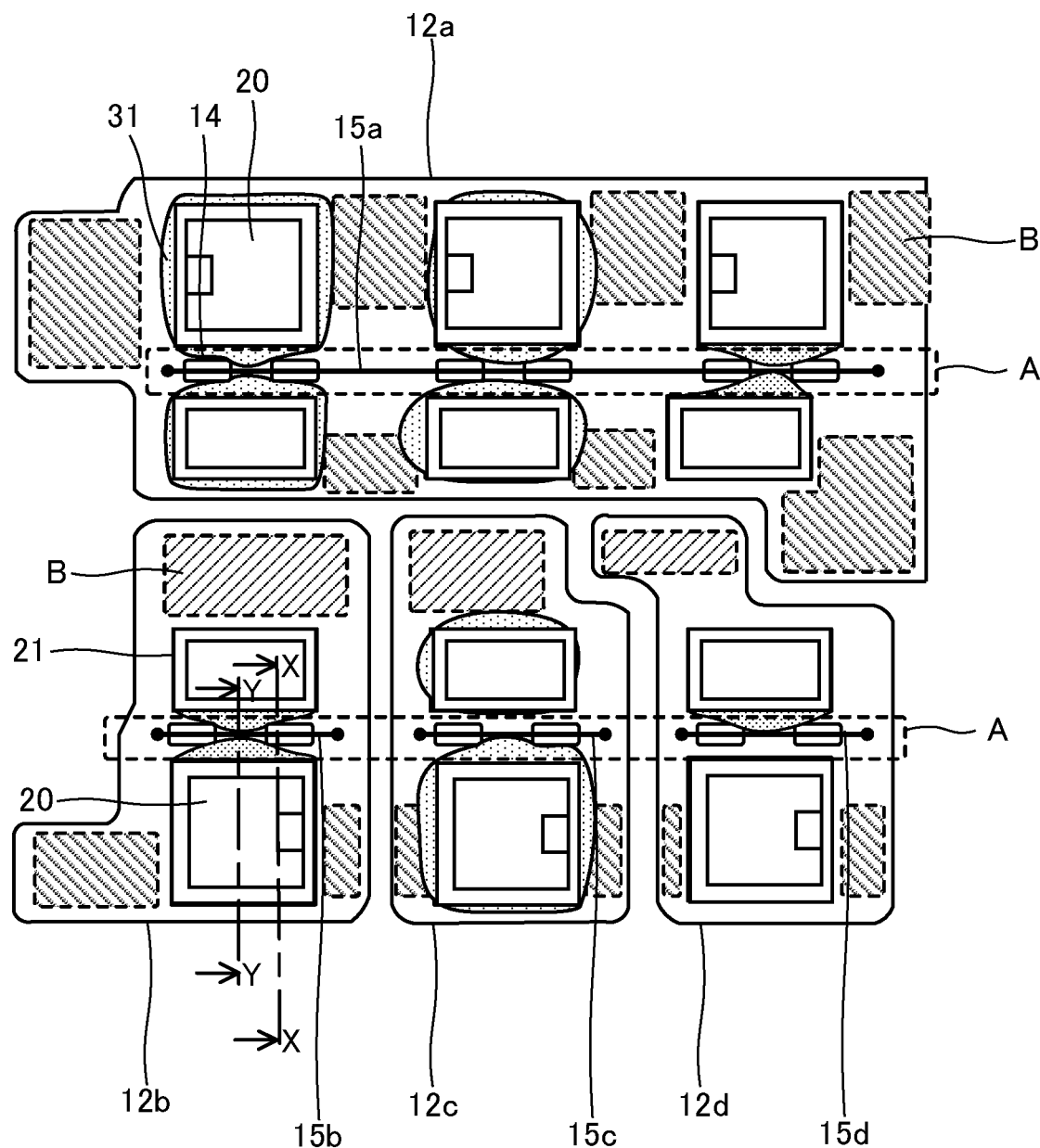
FIG. 15 is a plan view of a main part of the ceramic circuit board of the semiconductor device according to the first embodiment.
Figure 16A:
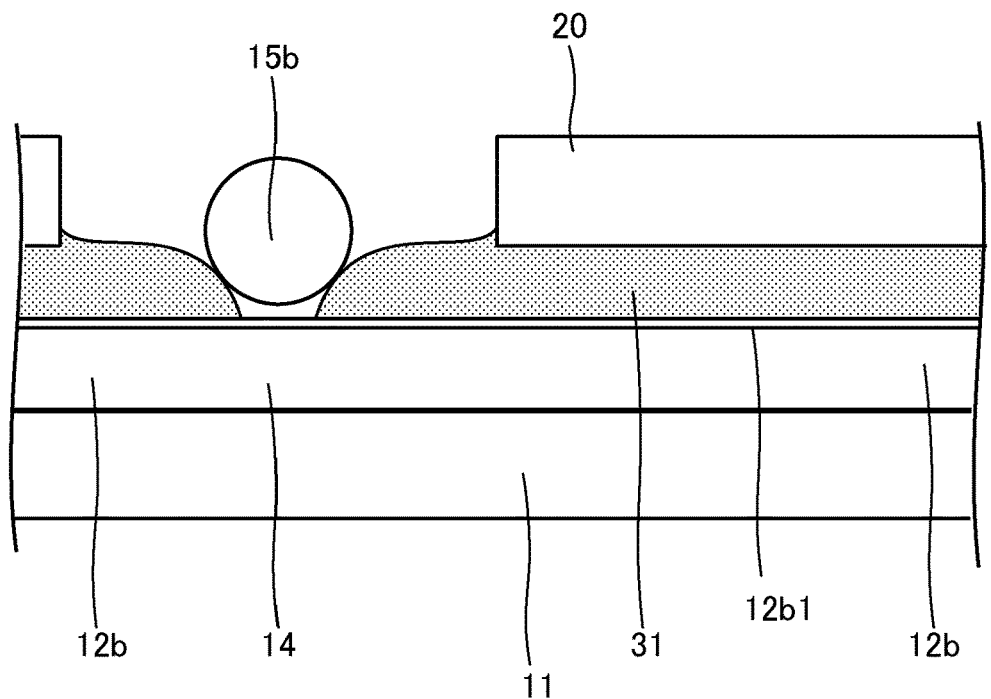
FIGS. 16A and 16B are each a sectional view of a main part of the ceramic circuit board of the semiconductor device according to the first embodiment.
Figure 16B:
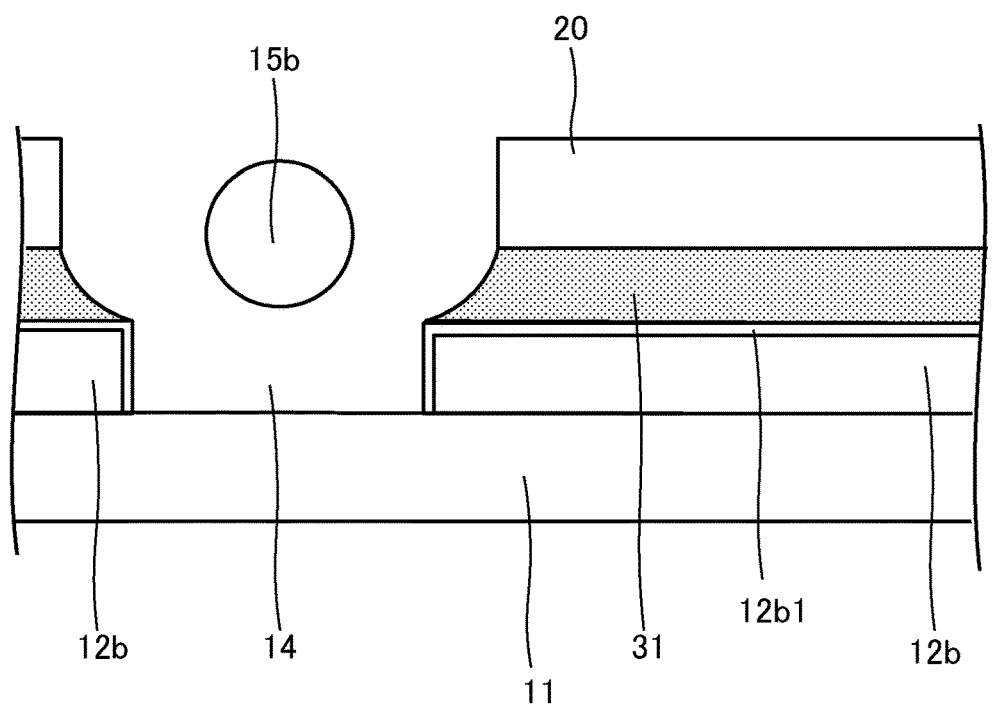

The semiconductor chips 20 and 21 and the solder 31 on the circuit boards 12 of the ceramic circuit board 10 in the reflow soldering performed in step S16 in the method for manufacturing the above semiconductor device 50 will now be described by the use of FIG. 15 and FIGS. 16A and 16B. FIG. 15 is a plan view of a main part of the ceramic circuit board of the semiconductor device according to the first embodiment. FIGS. 16A and 16B are each a sectional view of a main part of the ceramic circuit board of the semiconductor device according to the first embodiment. FIG. 16A is a sectional view taken along the dot-dash line Y-Y of FIG. 15. FIG. 16B is a sectional view taken along the dot-dash line X-X of FIG. 15. Furthermore, FIG. 15 and FIGS. 16A and 16B illustrate the circuit boards 12a through 12d of the ceramic circuit board 10 and their vicinities.

The semiconductor chips 20 and 21 are disposed over the circuit boards 12a through 12d with the solder 31 therebetween and the reflow soldering (step S16) is performed. As a result, the solder 31 melts and begins to spread to the outside of the disposition areas of the semiconductor chips 20 and 21. As illustrated in FIG. 15, for example, the solder 31 over the circuit board 12b on which the semiconductor chips 20 and 21 are disposed melts and flows out to the side of a gap A between the semiconductor chips 20 and 21. At this time the bonding wire 15b is located in the gap A between the semiconductor chips 20 and 21. Accordingly, even if the solder 31 on which the semiconductor chips 20 and 21 are disposed melts and flows out to the side of the gap A between the semiconductor chips 20 and 21, the flow is blocked by the bonding wire 15b. To be concrete, as illustrated in FIG. 16A, the molten solder 31 just under the semiconductor chips 20 and 21 is blocked by the bonding wire 15b in a portion over the circuit board 12b where a plating film 12b1 is formed and where a groove portion 14 is not formed. This prevents bonding between the solder 31 just under the semiconductor chip 20 and the solder 31 just under the semiconductor chip 21. Furthermore, as a result, as illustrated in FIG. 16B, the inflow of the solder 31 into a groove 14 is suppressed in a portion in the circuit board 12b where the groove portion 14 is formed. Naturally, with the other circuit board 12a, 12c, and 12d, bonding between the solder 31 just under the semiconductor chip 20 and the solder 31 just under the semiconductor chip 21 is suppressed in the same way by the bonding wires 15a, 15c, and 15d respectively. The solder 31 which melts in this way solidifies. By doing so, the semiconductor chips 20 and 21 are bonded to the circuit boards 12a through 12d. At this time the thickness of the solder 31 is greater than or equal to 100 μm and smaller than or equal to 200 μm.

Furthermore, in order to reliably block a spread of the solder 31 in the lateral direction of the groove portions 14 by the bonding wires 15a through 15d having a diameter larger than or equal to 125 μm and smaller than or equal to 400 μm, it is desirable that the bonding wires 15a through 15d be below the front surfaces of the semiconductor chips 20 and 21 and above the front surfaces of the circuit boards 12a through 12d.

The bonding wires 15a through 15d are located across the grooves 14 in the longitudinal direction of the grooves 14 in the gap A between the semiconductor chips 20 and 21 over each of the circuit boards 12a through 12d of the ceramic circuit board 10. On the other hand, it is desirable to set an outflow portion B (portion indicated by a dashed line in FIG. 15) where the bonding wires 15a through 15d are not formed in any area adjacent to the semiconductor chip 20 or 21 on each of the circuit boards 12a through 12d. As stated above, if the solder 31 which melts and attempts to spread is blocked by the bonding wires 15a through 15d, then the solder 31 attempts to spread to another portion where the bonding wires 15a through 15d are not formed. If bonding wires are formed on all sides of the semiconductor chip 20 or 21, then all spreads of the molten solder 31 are blocked. Accordingly, the molten solder 31 gets over one of the bonding wires formed on all sides of the semiconductor chip 20 or 21. As a result, bonding between the solder 31 just under the semiconductor chip 20 and the solder 31 just under the semiconductor chip 21 may occur. Therefore, setting the outflow portion B where the bonding wires 15a through 15d are not formed in any area adjacent to the semiconductor chip 20 or 21 on each of the circuit boards 12a through 12d is needed. As stated above, the bonding wires 15a through 15d block a spread of the molten solder 31. Accordingly, another member, such as a lead frame, which blocks a spread of the molten solder 31 may be used in place of the bonding wires 15a through 15d.

Figure 17:
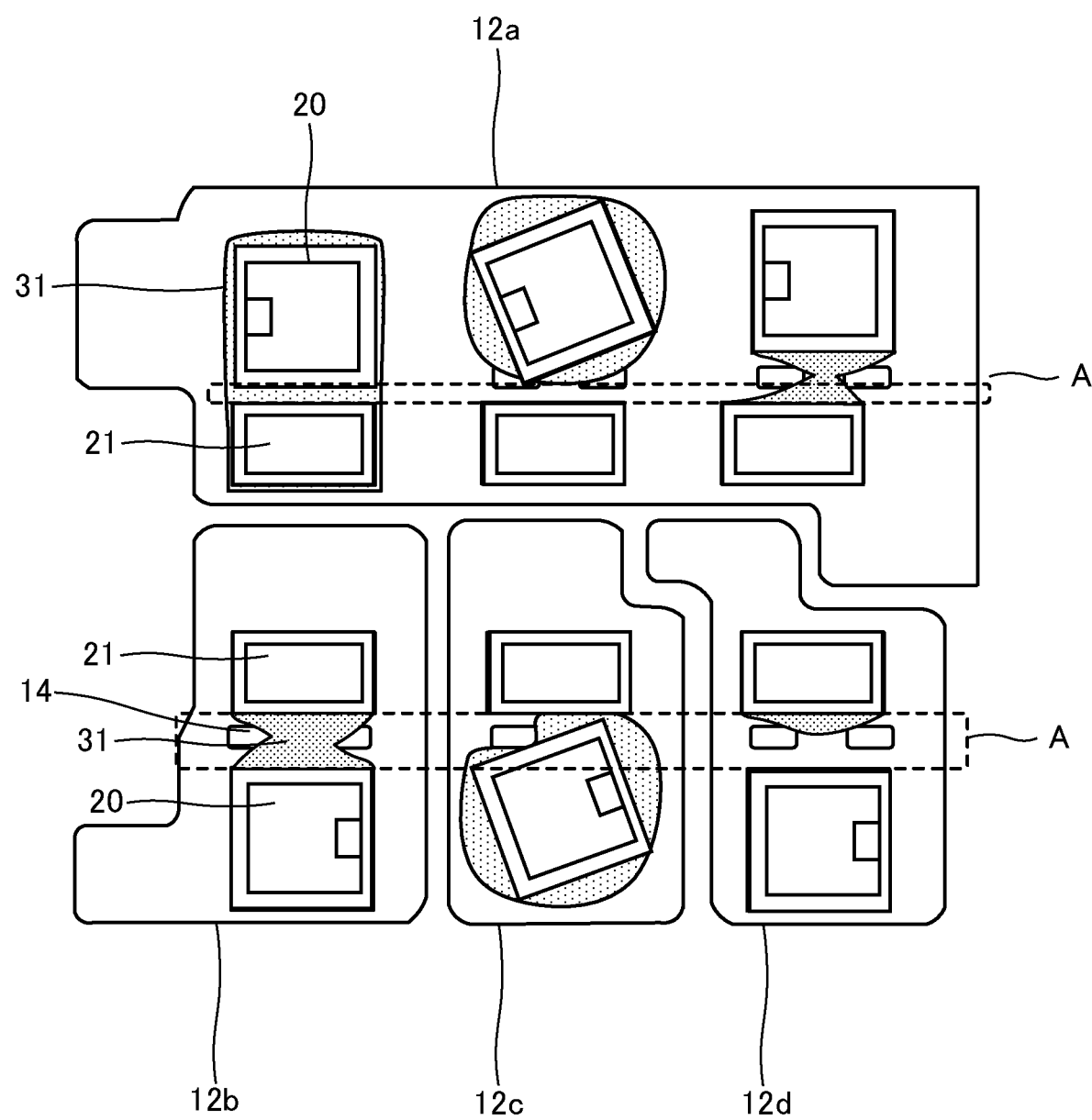
FIG. 17 is a plan view of a main part of a ceramic circuit board of a semiconductor device taken as a reference example.

A semiconductor device in which the bonding wires 15a through 15d are not formed will now be described by the use of FIG. 17. FIG. 17 is a plan view of a main part of a ceramic circuit board of a semiconductor device taken as a reference example. The structure of a semiconductor device taken as a reference example is the same as that of the semiconductor device 50. A semiconductor device taken as a reference example differs from the semiconductor device 50 only in that bonding wires 15a through 15d are not formed. Components in a semiconductor device taken as a reference example which are the same as those included in the semiconductor device 50 are marked with the same numerals and descriptions of them will be omitted. Furthermore, FIG. 17 corresponds to a case where the bonding wires 15a through 15d are not formed in FIG. 15. In FIG. 17, the bonding wires 15a through 15d are not formed. Accordingly, when the reflow soldering (step S16) described in FIG. 3 is performed, solder 31 spreads on all sides of a semiconductor chip 20 or 21. As a result, for example, each of a semiconductor chip 20 over (in the center of) a circuit board 12a and a semiconductor chip 20 over a circuit board 12c turns on its center or positionally deviates on the solder 31 which spreads. Part of the semiconductor chip 20 which turns is over a groove portion 14 with the solder therebetween. If the groove portion 14 is filled with the solder 31, then a void may appear in the groove portion 14. The appearance of a void deteriorates the heat dissipation property of the semiconductor chip 20. Furthermore, bonding between solder 31 just under a semiconductor chip 20 and solder 31 just under a semiconductor chip 21 occurs in gaps A on the circuit board 12a (on the left side or the right side) and the circuit board 12b. In this case, an electrical failure occurs.

The above semiconductor device 50 includes the ceramic circuit board 10. The ceramic circuit board 10 includes the circuit boards 12a through 12d and the insulating plate 11 over whose front surface the circuit boards 12a through 12d are formed. On the front surface of each of the circuit boards 12a through 12d, the disposition areas 20a and 21a are set parallel to the gap A with the gap A therebetween and the groove portions 14 whose longitudinal direction is parallel to the gap A are formed. Furthermore, the semiconductor device 50 includes the semiconductor chips 20 and 21 located over the disposition areas 20a and 21a, respectively, with the solder 31 therebetween and the bonding wires 15a through 15d located in plan view in the gap A across the groove portions 14 in the longitudinal direction of the groove portions 14. The bonding wires 15a through 15d block a spread of the solder 31 to the side of the gap A between the disposition areas 20a and 21a which melts by the reflow soldering performed in the process for manufacturing the semiconductor device 50. Accordingly, bonding in the gap A between the solder 31 just under the semiconductor chip 20 which spreads and the solder 31 just under the semiconductor chip 21 which spreads is prevented and a positional deviation of the semiconductor chip 20 or 21 is suppressed. As a result, deterioration in the heat dissipation property of the semiconductor chip 20 or 21 and the occurrence of an electrical failure are suppressed. Therefore, deterioration in the reliability of the semiconductor device 50 is suppressed.

Figure 18:
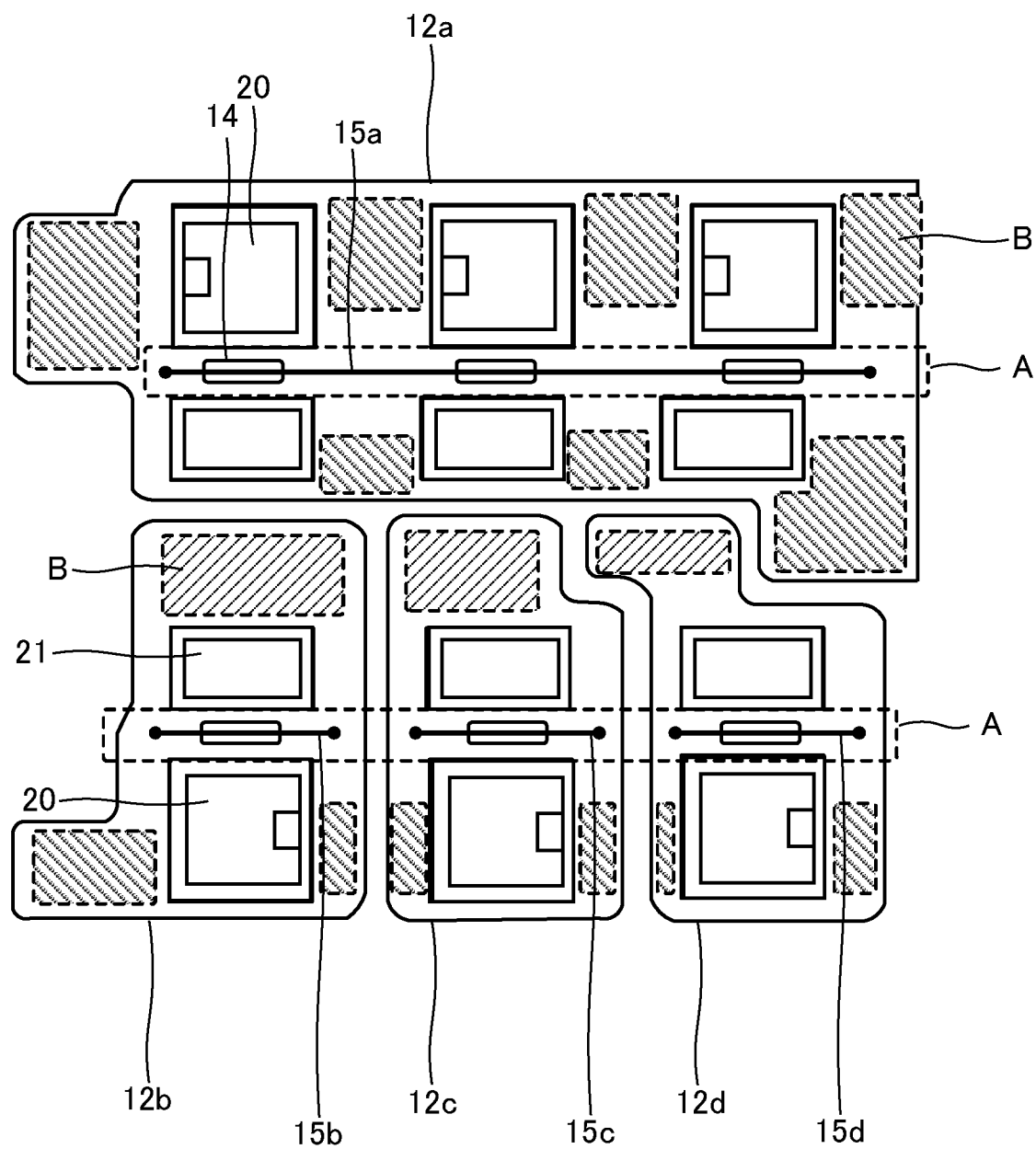
FIG. 18 is a plan view of a main part of another ceramic circuit board of the semiconductor device according to the first embodiment.

In the first embodiment, a case where two groove portions 14 are formed in the gap A between the disposition areas 20a and 21a is taken as an example and is described. However, the number of groove portions 14 is not limited to two. One groove portion 14 may be formed or three or more groove portions 14 may be formed according to space of the gap A. A case where one groove portion 14 is formed will now be described by the use of FIG. 18. FIG. 18 is a plan view of a main part of another ceramic circuit board of the semiconductor device according to the first embodiment. FIG. 18 illustrates a case where one groove portion 14 is formed in a gap A between disposition areas 20a and 21a in the longitudinal direction of the gap A in the semiconductor device 50. FIG. 18 does not illustrate solder 31 which spreads. In FIG. 18, a bonding wire 15a is located across three groove portions 14 over a circuit board 12a. Furthermore, bonding wires 15b through 15d are located across one groove portion 14 over circuit boards 12b through 12d respectively. In this case, the same effect that is obtained by the semiconductor device 50 is achieved.

Second Embodiment

Figure 19:
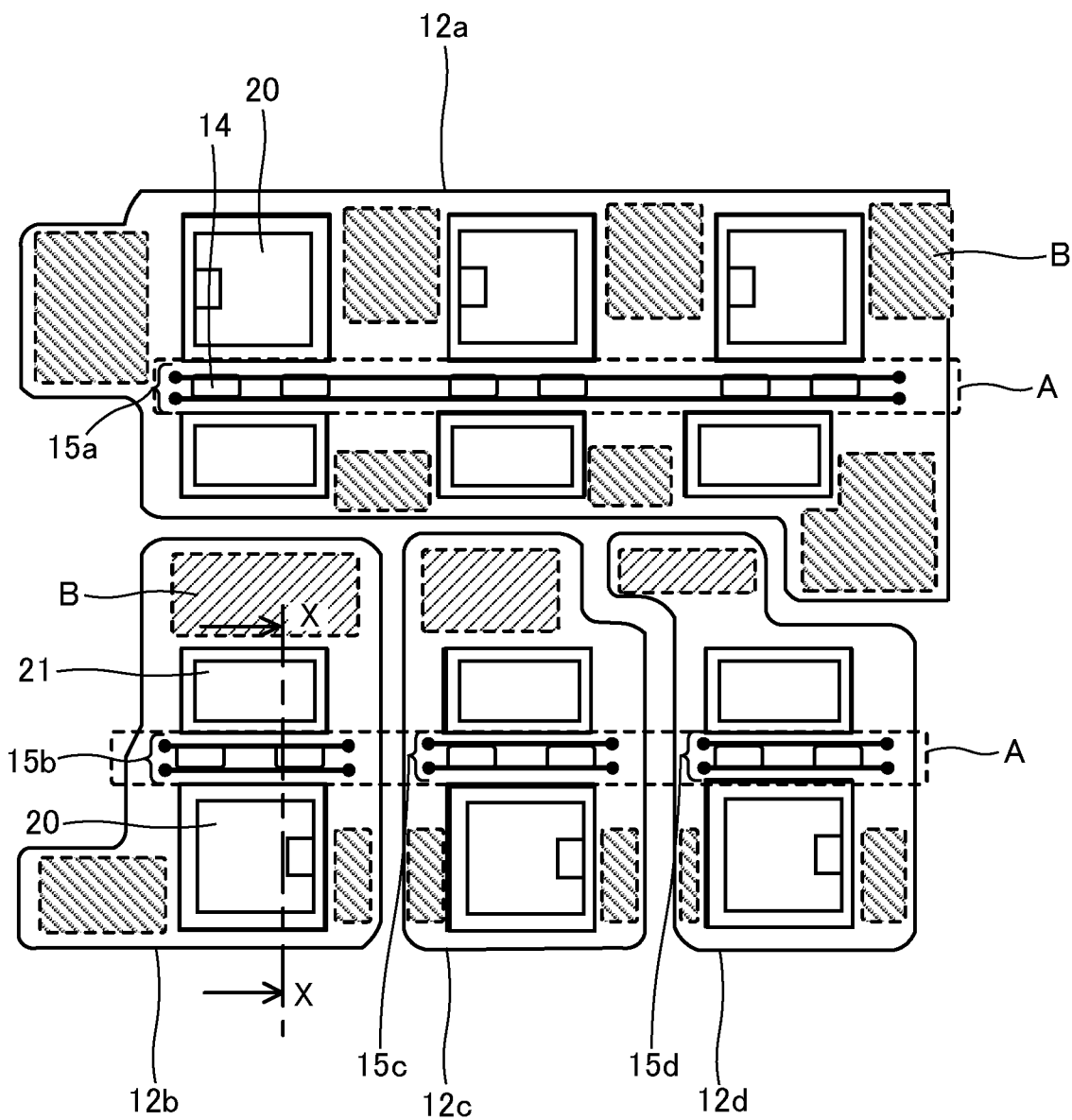
FIG. 19 is a plan view of a main part of a ceramic circuit board of a semiconductor device according to a second embodiment.
Figure 20:
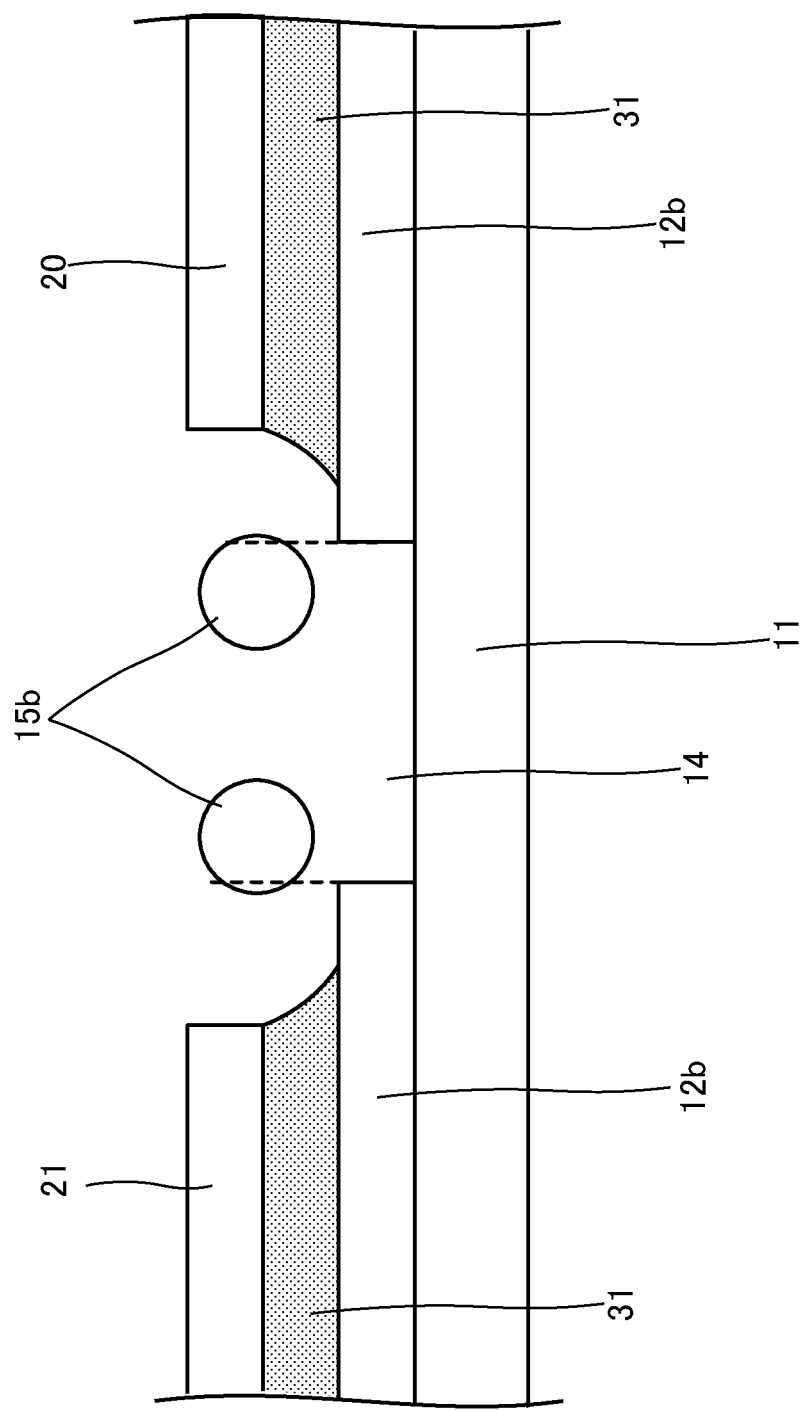
FIG. 20 is a sectional view of a main part of the ceramic circuit board of the semiconductor device according to the second embodiment.
Figure 21:
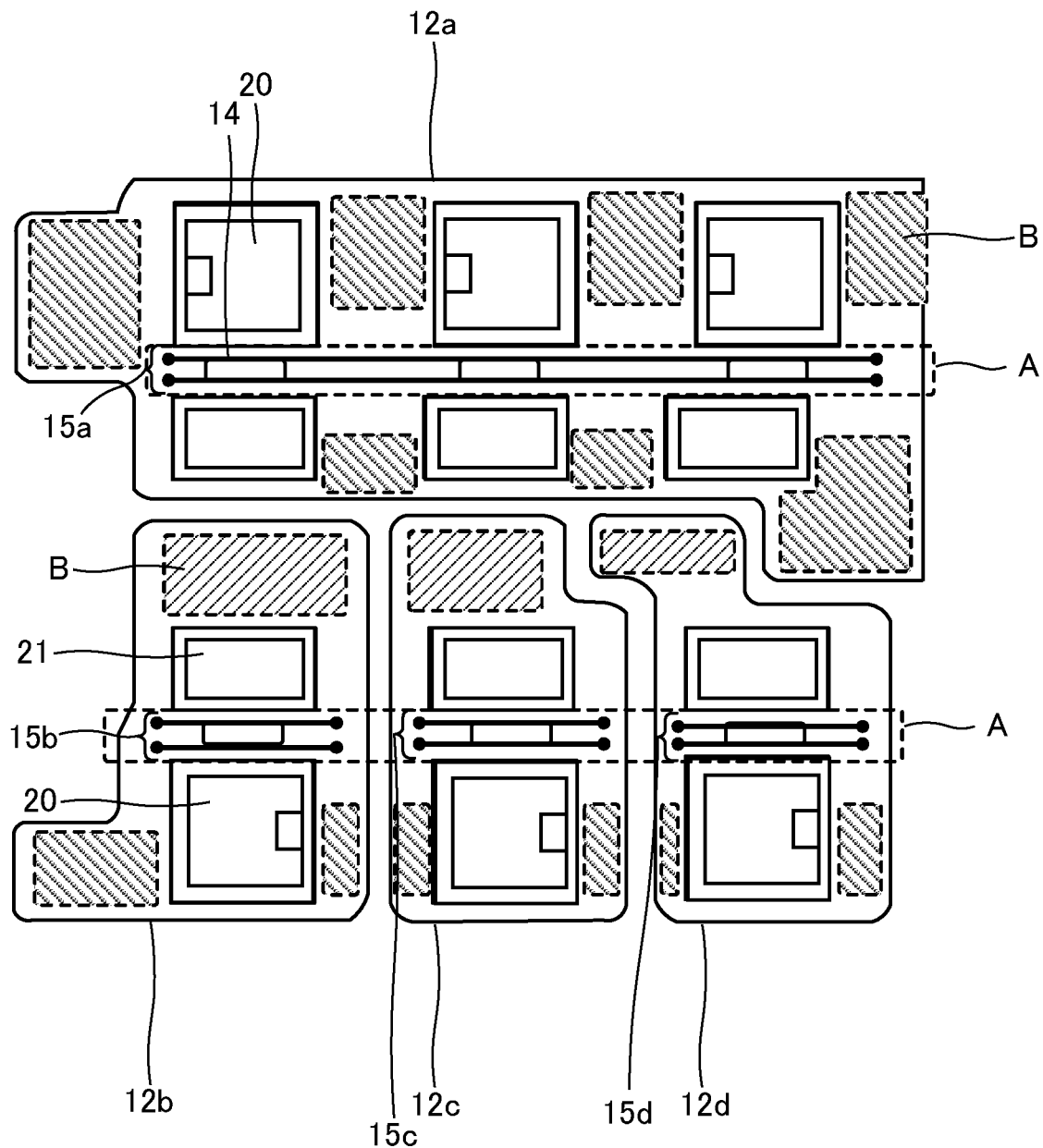
FIG. 21 is a plan view of a main part of another ceramic circuit board of the semiconductor device according to the second embodiment.

In a second embodiment the fixing of bonding wires 15a through 15d which differs from the fixing of the bonding wires 15a through 15d in the first embodiment will be described by reference to FIG. 19 to FIG. 21. FIG. 19 is a plan view of a main part of a ceramic circuit board of a semiconductor device according to a second embodiment. FIG. 20 is a sectional view of a main part of the ceramic circuit board of the semiconductor device according to the second embodiment. FIG. 21 is a plan view of a main part of another ceramic circuit board of the semiconductor device according to the second embodiment. FIG. 19 corresponds to the portion of the semiconductor device 50 according to the first embodiment illustrated in FIG. 15. FIG. 20 is a sectional view taken along the dot-dash line X-X of FIG. 19. FIG. 21 corresponds to the portion of the semiconductor device 50 according to the first embodiment illustrated in FIG. 18. Furthermore, components in the semiconductor device according to the second embodiment which are the same as those included in the semiconductor device 50 according to the first embodiment are marked with the same numerals and descriptions of them will be omitted.

As illustrated in FIG. 19 and FIG. 20, with the semiconductor device according to the second embodiment each of bonding wires 15a through 15d located across groove portions 14 includes not one wire but two wires. Each of the bonding wires 15a through 15d may include three or more wires according to space of a gap A. Furthermore, for example, as illustrated in FIG. 20, the bonding wire 15b located across the groove portions 14 over a circuit board 12b and including a pair of wires matches the boundaries between the groove portions 14 and the circuit board 12b or is on the circuit board 12b side of the boundaries, in plan view. In this case, the distance between the boundaries and the bonding wire 15b is shorter than fifty percent of the diameter of the bonding wire 15b. By locating the bonding wire 15b including a plurality of wires in this way across the groove portions 14, a spread of molten solder 31 is blocked more reliably. In addition, as illustrated in FIG. 21, a plurality (two in FIG. 21) of bonding wires 15b to 15d may be located across one groove portion 14. In this case, the bonding wires 15b to 15d located across the groove portions 14 are able to block a spread of molten solder 31 more reliably, as in FIGS. 19 and 20. Therefore, the arrangement of bonding wires is not limited to the one illustrated in FIGS. 15 and 18, and the arrangement illustrated in FIG. 19, in which the plurality of bonding wires 15a to 15d are located across the plurality of grove portions 14, and the arrangement illustrated in FIG. 21, in which the plurality of bonding wires 15b to 15d are located across each groove portion 14, are also applicable.

Third Embodiment

Figure 22:
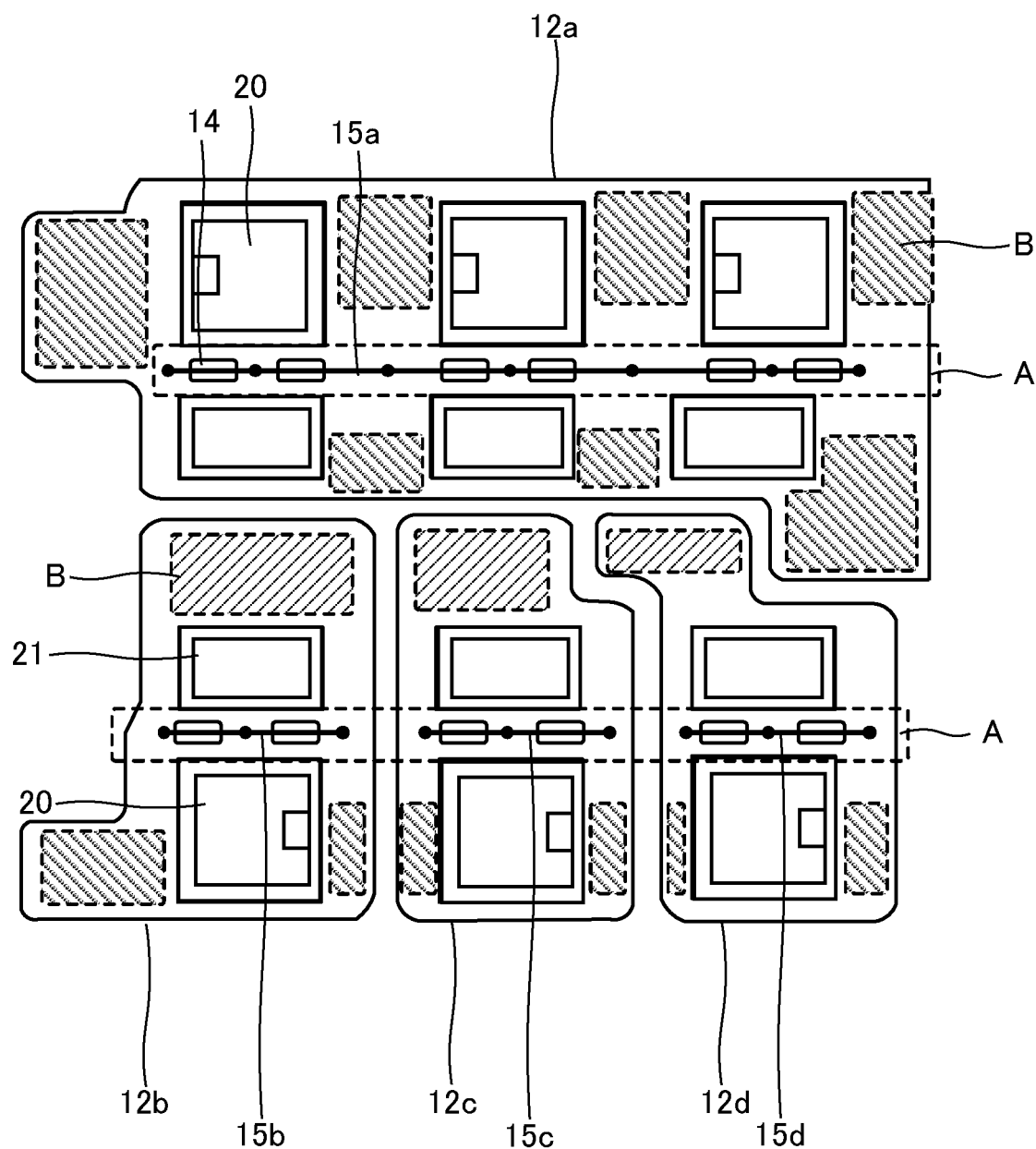
FIG. 22 is a plan view of a main part of a ceramic circuit board of a semiconductor device according to a third embodiment.

In a third embodiment a case where the bonding wires 15a through 15d included in the semiconductor device 50 according to the first embodiment are located across groove portions 14 by stitch bonding will be described by the use of FIG. 22. FIG. 22 is a plan view of a main part of a ceramic circuit board of a semiconductor device according to a third embodiment. FIG. 22 corresponds to the portion of the semiconductor device 50 according to the first embodiment illustrated in FIG. 15. Furthermore, FIG. 22 does not illustrate solder 31 which spreads. In addition, components in the semiconductor device according to the third embodiment which are the same as those included in the semiconductor device 50 according to the first embodiment are marked with the same numerals and descriptions of them will be omitted.

As illustrated in FIG. 22, with the semiconductor device according to the third embodiment bonding wires 15a through 15d are located across groove portions 14 over circuit boards 12a through 12d, respectively, by performing stitch bonding between groove portions 14. By locating the bonding wires 15a through 15d in this way across the groove portions 14 by performing stitch bonding between the groove portions 14, a spread of the molten solder 31 is blocked more reliably.

According to the disclosed technique, a spread of a bonding member between adjacent semiconductor chips is suppressed and a positional deviation of a semiconductor chip is reliably prevented. As a result, a semiconductor device which suppresses deterioration in reliability is provided.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a substrate including
      an insulating plate having a front surface, and
      a circuit board provided on the front surface of the insulating plate, the circuit board having
         a first disposition area and a second disposition area with a gap therebetween, and
         a groove portion, of which a longitudinal direction is parallel to the gap, formed in the gap;
   a first semiconductor chip located on the circuit board in the first disposition area;
   a second semiconductor chip located on the circuit board in the second disposition area; and
   a blocking member, which is a bonding wire, located in the gap across the groove portion in parallel to the longitudinal direction in a plan view of the semiconductor device, the first semiconductor chip and the second semiconductor chip having the blocking member directly therebetween.

2. The semiconductor device according to claim 1, wherein the blocking member is of a linear shape.

3. The semiconductor device according to claim 2, wherein the blocking member is longer than the groove portion in the longitudinal direction.

4. The semiconductor device according to claim 3, wherein a width of the blocking member is narrower than a width of the groove portion.

5. The semiconductor device according to claim 2, wherein
   the blocking member is made of a metal.

6. The semiconductor device according to claim 2, wherein the blocking member is bonded to the circuit board across the groove portion in the longitudinal direction.

7. The semiconductor device according to claim 2, wherein the blocking member is located, in a depth direction of the semiconductor device, below front surfaces of the first semiconductor chip and the second semiconductor chip, and above a front surface of the circuit board.

8. The semiconductor device according to claim 2, wherein the groove portion includes a plurality of groove portions, a longitudinal direction of each of which is parallel to the gap, the plurality of groove portions being aligned.

9. The semiconductor device according to claim 8, wherein the blocking member is located across the plurality of groove portions in parallel with the gap.

10. The semiconductor device according to claim 9, wherein the blocking member is located across each of the plurality of groove portions and is bonded to the circuit board between adjacent ones of the plurality of groove portions.

11. The semiconductor device according to claim 1, wherein the circuit board has an outflow portion, over which the blocking member is not formed, adjacent to each of the first semiconductor chip and the second semiconductor chip.

12. The semiconductor device according to claim 1, wherein the circuit board is made of copper or a copper alloy.

13. The semiconductor device according to claim 12, wherein the blocking member is made of aluminum, nickel, iron, or an alloy containing one of aluminum, nickel, and iron.

14. The semiconductor device according to claim 1, further comprising a plating film formed on at least the first disposition area and the second disposition area of the circuit board.

15. The semiconductor device according to claim 14, wherein the plating film is made of nickel or a nickel alloy.

16. The semiconductor device according to claim 1, wherein
   each of the first and second semiconductor chips is formed on the circuit board with a bonding member therebetween.

17. A semiconductor device, comprising:
   a substrate including
      an insulating plate having a front surface, and
      a circuit board provided on the front surface of the insulating plate, the circuit board having
         a first disposition area and a second disposition area with a gap therebetween, and
         a groove portion, of which a longitudinal direction is parallel to the gap, formed in the gap;
   a first semiconductor chip located on the circuit board in the first disposition area;
   a second semiconductor chip located on the circuit board in the second disposition area; and
   a blocking member located in the gap across the groove portion in parallel to the longitudinal direction in a plan view of the semiconductor device, wherein
   the blocking member is of a linear shape, and is located in plurality across the groove portion.

18. A semiconductor device, comprising:
   a substrate including
      an insulating plate having a front surface, and
      a circuit board provided on the front surface of the insulating plate, the circuit board having
         a first disposition area and a second disposition area with a gap therebetween, and
         a groove portion, of which a longitudinal direction is parallel to the gap, formed in the gap;

a first semiconductor chip located on the circuit board in the first disposition area;

a second semiconductor chip located on the circuit board in the second disposition area; and a blocking member located in the gap across the groove portion in parallel to the longitudinal direction in a plan view of the semiconductor device, wherein the blocking member is made of a metal having a solder wettability lower than a solder wettability of the circuit board.

19. The semiconductor device according to claim 18, wherein the blocking member is made of aluminum or an aluminum alloy.

* * * * *